United States Patent
Chang et al.

(10) Patent No.: US 11,259,394 B2
(45) Date of Patent: Feb. 22, 2022

(54) LASER PRODUCED PLASMA ILLUMINATOR WITH LIQUID SHEET JET TARGET

(71) Applicant: KLA Corporation, Milpitas, CA (US)

(72) Inventors: Chao Chang, San Jose, CA (US); Will Schumaker, Capitola, CA (US); Jongjin Kim, San Jose, CA (US); Michael Friedmann, Mountain View, CA (US)

(73) Assignee: KLA Corporation, Milipitas, CA (US)

( * ) Notice: Subject to any disclaimer, the term of this patent is extended or adjusted under 35 U.S.C. 154(b) by 0 days.

(21) Appl. No.: 17/076,767

(22) Filed: Oct. 21, 2020

(65) Prior Publication Data
US 2021/0136901 A1 May 6, 2021

Related U.S. Application Data

(60) Provisional application No. 62/929,560, filed on Nov. 1, 2019.

(51) Int. Cl.
*H05G 2/00* (2006.01)

(52) U.S. Cl.
CPC ............. *H05G 2/008* (2013.01); *H05G 2/006* (2013.01)

(58) Field of Classification Search
CPC .............................. H05G 2/008; H05G 2/006
See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |
| 6,023,338 A | 2/2000 | Bareket |
| 6,320,937 B1 | 11/2001 | Mochizuki |
| 6,429,943 B1 | 8/2002 | Opsal et al. |

(Continued)

FOREIGN PATENT DOCUMENTS

KR   10-1503894 B1   3/2015

OTHER PUBLICATIONS

Lemaillet, Germer, Kline et al.,"Intercomparison between optical and x-ray scatterometry measurements of FinFET structures" by Proc. SPIE, v.8681, p. 86810Q (2013).

(Continued)

*Primary Examiner* — Nicole M Ippolito
*Assistant Examiner* — Hanway Chang
(74) *Attorney, Agent, or Firm* — Spano Law Group; Joseph S. Spano

(57) ABSTRACT

Methods and systems for generating X-ray illumination from a laser produced plasma (LPP) employing a liquid sheet jet target are presented herein. A highly focused, short duration laser pulse is directed to a liquid sheet jet target. The interaction of the focused laser pulse with the sheet jet target ignites a plasma. In some embodiments, the liquid sheet jet is generated by a convergent capillary nozzle or a convergent, planar cavity nozzle. In some embodiments, the target material includes one or more elements having a relatively low atomic number. In some embodiments, the liquid sheet jet LPP light source generates multiple line or broadband X-ray illumination in a soft X-ray (SXR) spectral range used to measure structural and material characteristics of semiconductor structures. In some embodiments, Reflective, Small-Angle X-ray Scatterometry measurements are performed with a liquid sheet jet LPP illumination source as described herein.

23 Claims, 12 Drawing Sheets

(56) References Cited

U.S. PATENT DOCUMENTS

| | | |
|---|---|---|
| 6,716,646 B1 | 4/2004 | Wright et al. |
| 6,778,275 B2 | 8/2004 | Bowes |
| 6,787,773 B1 | 9/2004 | Lee |
| 6,992,764 B1 | 1/2006 | Yang et al. |
| 7,242,477 B2 | 7/2007 | Mieher et al. |
| 7,321,426 B1 | 1/2008 | Poslavsky et al. |
| 7,351,980 B2 | 4/2008 | Lange |
| 7,406,153 B2 | 7/2008 | Berman |
| 7,427,766 B2 | 9/2008 | Jonkers et al. |
| 7,478,019 B2 | 1/2009 | Zangooie et al. |
| 7,599,470 B2 | 10/2009 | Kloepfel et al. |
| 7,626,702 B2 | 12/2009 | Ausschnitt et al. |
| 7,656,528 B2 | 2/2010 | Abdulhalim et al. |
| 7,705,331 B1 | 4/2010 | Kirk et al. |
| 7,826,071 B2 | 11/2010 | Shchegrov et al. |
| 7,842,933 B2 | 11/2010 | Shur et al. |
| 7,873,585 B2 | 1/2011 | Izikson |
| 7,920,676 B2 | 4/2011 | Yun et al. |
| 7,929,667 B1 | 4/2011 | Zhuang et al. |
| 7,933,026 B2 | 4/2011 | Opsal et al. |
| 8,068,662 B2 | 11/2011 | Zhang et al. |
| 8,138,498 B2 | 3/2012 | Ghinovker |
| 8,198,615 B2 | 6/2012 | Bykanov et al. |
| 8,258,485 B2 | 9/2012 | Levesque et al. |
| 8,749,179 B2 | 6/2014 | Liu et al. |
| 8,941,336 B1 | 1/2015 | Liu et al. |
| 8,963,110 B2 | 2/2015 | Hale et al. |
| 9,295,147 B2 | 3/2016 | Bykanov et al. |
| 9,420,678 B2 | 8/2016 | Bykanov et al. |
| 9,422,978 B2 | 8/2016 | Chilese et al. |
| 9,544,984 B2 | 1/2017 | Bykanov et al. |
| 9,915,522 B1 | 3/2018 | Jiang et al. |
| 9,918,375 B2 | 3/2018 | Kuritsyn et al. |
| 9,989,758 B2 | 6/2018 | Kuritsyn et al. |
| 10,021,773 B2 | 7/2018 | Kuritsyn et al. |
| 10,034,362 B2 | 7/2018 | Kuritsyn et al. |
| 10,101,664 B2 | 10/2018 | Kuritsyn et al. |
| 2003/0021465 A1 | 1/2003 | Adel et al. |
| 2003/0067598 A1 | 4/2003 | Tomie et al. |
| 2004/0170252 A1 | 9/2004 | Richardson |
| 2006/0103725 A1 | 5/2006 | Brown et al. |
| 2007/0036183 A1 | 2/2007 | Kim |
| 2007/0158540 A1 | 7/2007 | Faubel et al. |
| 2007/0221842 A1 | 9/2007 | Morokuma et al. |
| 2007/0228288 A1 | 10/2007 | Smith et al. |
| 2008/0308644 A1 | 12/2008 | Faubel et al. |
| 2009/0152463 A1 | 6/2009 | Toyoda et al. |
| 2010/0188655 A1 | 7/2010 | Brown et al. |
| 2010/0188738 A1 | 7/2010 | Epple et al. |
| 2010/0213395 A1 | 8/2010 | Ueno et al. |
| 2011/0116604 A1 | 5/2011 | Faubel et al. |
| 2011/0141865 A1 | 6/2011 | Senekerimyan et al. |
| 2011/0240890 A1 | 11/2011 | Govindaraju et al. |
| 2011/0266440 A1 | 11/2011 | Boughorbel et al. |
| 2012/0292502 A1 | 11/2012 | Langer et al. |
| 2013/0208279 A1 | 8/2013 | Smith |
| 2013/0304424 A1 | 11/2013 | Bakeman et al. |
| 2014/0019097 A1 | 1/2014 | Bakeman et al. |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2014/0297211 A1 | 10/2014 | Pandev et al. |
| 2015/0110249 A1 | 4/2015 | Bakeman et al. |
| 2015/0117610 A1 | 4/2015 | Veldman et al. |
| 2015/0204664 A1 | 7/2015 | Bringoltz et al. |
| 2015/0204802 A1 | 7/2015 | Pois et al. |
| 2015/0300965 A1 | 10/2015 | Sezginer et al. |
| 2015/0306620 A1 | 10/2015 | Faubel et al. |
| 2016/0202193 A1 | 7/2016 | Hench et al. |
| 2017/0131129 A1 | 5/2017 | Ahr et al. |
| 2017/0167862 A1 | 6/2017 | Dziura et al. |
| 2018/0106735 A1 | 4/2018 | Gellineau et al. |
| 2018/0206318 A1 | 7/2018 | Deciccio et al. |
| 2019/0017946 A1 | 1/2019 | Wack et al. |
| 2019/0069385 A1 | 2/2019 | Khodykin et al. |
| 2019/0215940 A1 | 7/2019 | Khodykin et al. |

OTHER PUBLICATIONS

Kline et al., "X-ray scattering critical dimensional metrology using a compact x-ray source for next generation semiconductor devices," J. Micro/Nanolith. MEMS MOEMS 16(1), 014001 (Jan.-Mar. 2017).

Ohashi, H., et al., "Quasi-Moseley's law for strong narrow bandwidth soft x-ray sources containing higher charge-state ions", Appl. Phys. Lett. 106, 169903 (2015).

Aerts, Robby, et al., "Carbon dioxide splitting in a dielectric barrier discharge plasma : a combined experimental and computational study", Chemsuschem—ISSN 1864-5631—8:4(2015), p. 702-716.

International Search Report dated Feb. 15, 2021, for PCT Application No. PCT/US2020/057434 filed on Oct. 27, 2020 by KLA-Tencor Corporation, 3 pages.

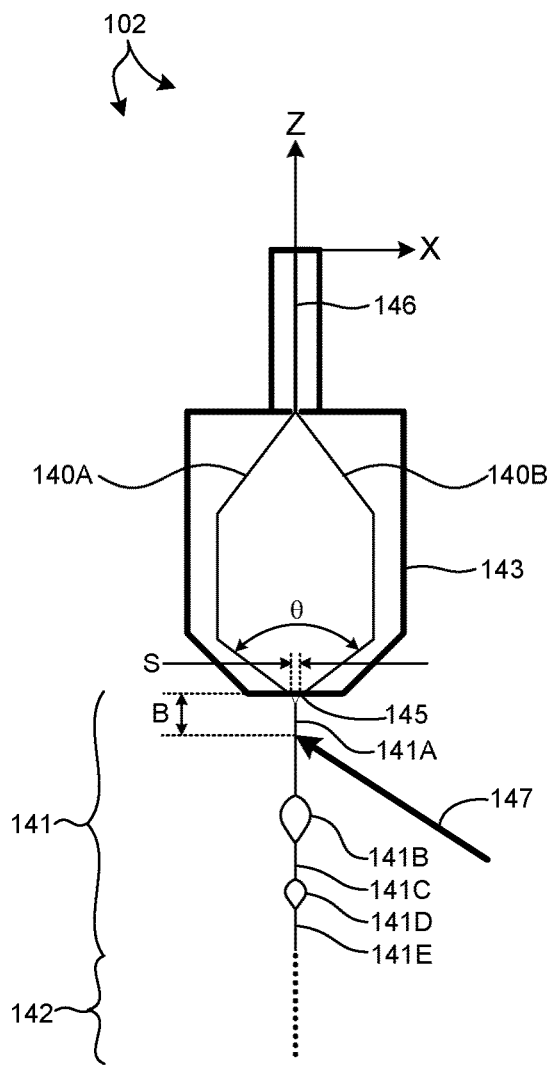
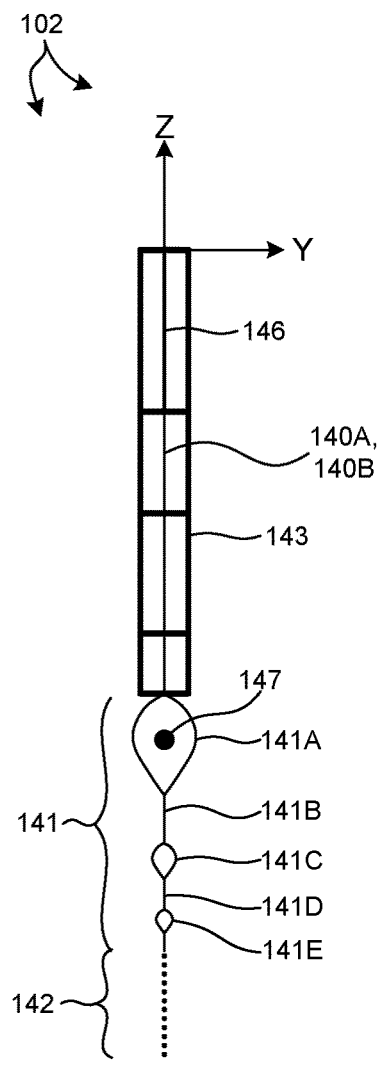
FIG. 3A  FIG. 3B
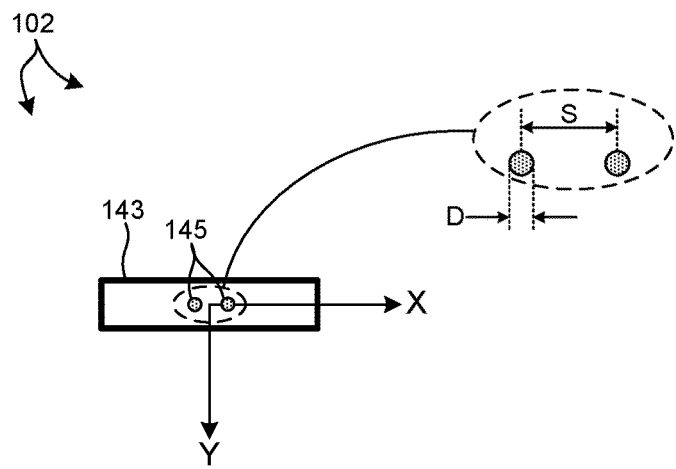
FIG. 3C

LASER PRODUCED PLASMA ILLUMINATOR WITH LIQUID SHEET JET TARGET

CROSS REFERENCE TO RELATED APPLICATION

The present application for patent claims priority under 35 U.S.C. § 119 from U.S. provisional patent application Ser. No. 62/929,560, filed Nov. 1, 2019, the subject matter of which is incorporated herein by reference in its entirety.

TECHNICAL FIELD

The described embodiments relate to x-ray metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry, diffractometry, and reflectometry implementations and associated analysis algorithms are commonly used to characterize critical dimensions, film thicknesses, composition and other parameters of nanoscale structures.

Traditionally, scatterometry critical dimension measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty.

Accurate information concerning the material composition and shape of nanostructures is limited in the process development environment of a leading-edge front-end semiconductor fabrication facility. Scatterometric optical metrology systems rely on accurate geometric and dispersion models to avoid measurement bias. With limited knowledge of material composition and shape of nanostructures available apriori, measurement recipe development and validation is a slow and tedious process. For example, cross-sectional transmission electron microscopy (TEM) images are used to guide optical scatterometry model development, but TEM imaging is slow and destructive.

Scatterometric optical metrology tools utilizing infrared to visible light measure zero-order diffraction signals from sub-wavelength structures. As device critical dimensions continue to shrink scatterometric optical metrology sensitivity and capability is decreasing. Furthermore, when absorbing materials are present in the structure under measurement, penetration and scattering of illumination light in the optical region (e.g., 0.5-10 ev) limits the utility of conventional optical metrology systems.

Similarly, electron beam based metrology systems struggle to penetrate semiconductor structures due to absorption and scattering of the illuminating, backscattered, and secondary emission electrons.

Atomic force microscopes (AFM) and scanning-tunneling microscopes (STM) are able to achieve atomic resolution, but they can only probe the surface of the specimen. In addition, AFM and STM microscopes require long scanning times that make these technologies impractical in a high volume manufacturing (HVM) setting.

Scanning electron microscopes (SEM) achieve intermediate resolution levels, but are unable to penetrate structures to sufficient depth. Thus, high-aspect ratio holes are not characterized well. In addition, the required charging of the specimen has an adverse effect on imaging performance.

X-ray based scatterometry systems have shown promise to address challenging measurement applications. For example, Transmission, Small-Angle X-Ray Scatterometry (T-SAXS) systems employing photons at a hard X-ray energy level (>15 keV), Grazing Incidence, Small-Angle X-Ray Scatterometry (GI-SAXS) systems operating near the critical angles for reflection with photon energies above 8 keV, and Reflective Small Angle X-ray Scatterometry (RSAXS) systems employing photons in a soft x-ray (SXR) region (80-5,000 eV) have exhibited the potential to address different metrology applications within the semiconductor industry.

In some embodiments, RSAXS systems offer a unique combination of sensitivity and speed. Nominal grazing angles of incidence in a range between 5 and 20 degrees offers the flexibility to select optimal angles of incidence to achieve a desired penetration into the structure under measurement and maximize measurement information content with a small beam spot size (e.g., less than 50 µm).

Although X-ray based metrology systems offer attractive solutions to current and future semiconductor measurement applications, the development of a reliable and cost effective X-ray illumination source has been challenging. A significant amount of effort has been expended to develop various versions of a Laser Produced Plasma (LPP) X-ray illumination source. In an LPP X-ray illumination source, a target material is irradiated by an excitation source in a vacuum chamber to produce plasma. In some examples, the excitation source is a pulsed laser beam.

In general, the peak emission observed in optically thin plasmas of relatively high atomic number (high-Z) elements in the Extreme Ultraviolet (EUV) and Soft X-Ray (SXR) spectral regions follows a quasi-Moseley's law as described by H. Ohashi, et al., Appl. Phys. Lett. 106, 169903, 2015, the content of which is incorporated herein by reference in its entirety. The peak wavelength, $\lambda_{peak}$, is illustrated in equation (1), where $R_\infty$ is the Rydberg constant and Z is the atomic number of the element undergoing stimulated emission.

$$\lambda_{peak}=(2.186\pm12.09)/R_\infty[Z-(23.23\pm2.87)]^{-(1.52\pm0.12)} \quad (1)$$

As the atomic number, Z, increases from Z=50 (Tin) to Z=83 (Bismuth), the emission peak shifts from 13.5 nm to 4.0 nm. A Tin based LPP illumination source offers optimal conversion efficiency for EUV lithography at 13.5 nanometers. In addition, light generated by a Tin based LPP illumination source is efficiently reflected by Molybdenum/ Silicon Multi-Layer Mirrors (MLM). As a result, a LPP target element having a relatively high atomic number is typically selected for EUV applications. A Tin based illumination source is currently employed by the leading manufacturer of EUV lithography tools (ASML).

In some embodiments, EUV or SXR radiation is produced by electrical discharge of tin for EUV lithography or EUV/SXR metrology applications. A plasma is ignited in a gaseous medium between at least two electrodes in a discharge space. The gaseous medium is produced by partial vaporization of Tin by a laser beam from the surface of rotational disks in the discharge space. Additional description is provided in U.S. Pat. No. 7,427,766, the content of which is incorporated herein by reference in its entirety.

Unfortunately, the difficulties associated with debris mitigation and target replenishment associated with Tin significantly limit EUV tool availability and lead to extremely high tool cost. Tin debris deposition on the chamber walls and optical elements of EUV tools is significant. In some examples, hydrogen buffer gas is employed to protect and clean optics contaminated by Tin debris. However, implementation of hydrogen buffer gas gives rise to high cost to address safety issues.

In an attempt to avoid the challenges associated with the use of Tin targets, Xenon (Z=54) has been considered as a suitable LPP target. Inert, cryogenic Xenon ice employed as a LPP target is chemically inactive and vaporizes instantly at room temperature. Thus, debris generated by the Xenon LPP target is not deposited on optical components. Xenon has a series of Unresolved Transition Arrays (UTA) in several charge states in the EUV and SXR spectral ranges. Thus, Xenon has the potential to generate useful emission for lithography and metrology applications.

In some embodiments, solid Xenon ice target material is formed on the surface of a drum cooled by liquid nitrogen. A laser pulse irradiates a small area of solid Xenon target material deposited on the drum. The drum is rotated, translated, or both, to present new solid Xenon target material at the irradiation site. Each laser pulse generates a crater in the layer of solid Xenon target material. The craters are refilled by a replenishment system that provides new Xenon target material to the drum surface. Additional description is provided in U.S. Pat. Nos. 6,320,937, 8,963,110, 9,422,978, 9,544,984, 9,918,375, and 10,021,773, the contents of which are incorporated herein by reference in their entirety.

In some embodiments, a stream of liquid Xenon target material is employed as an LPP target. In one embodiment, a Xenon liquefier unit is connected to a Xenon mass flow (gas) system within a vacuum chamber, along with a Xenon recovery unit. The Xenon recovery unit is connected to the Xenon liquefier unit via a capillary tube. A stream of liquid Xenon flows from the Xenon liquefier unit to the Xenon recovery unit through the capillary tube. The capillary tube includes an aperture that exposes the stream of liquid Xenon to a focused laser beam that induces a plasma emitting EUV/SXR radiation. Additional description is provided in U.S. Pat. No. 8,258,485, which is incorporated herein by reference in its entirety.

In some other embodiments, a droplet of liquid Xenon target material is employed as an LPP target. In one embodiments, Xenon is pressurized and cooled such that it liquefies. The liquid Xenon is pumped through a nozzle as a jet. As the jet emerges from the nozzle, it begins to decay. As the jet decays, Xenon droplets are formed. The droplets may be liquid or solid depending on conditions. The droplets travel to a site in a vacuum environment where the droplets are irradiated by a laser beam to produce an EUV/SXR emitting plasma. Additional description is provided in U.S. Pat. No. 9,295,147 and U.S. Patent Publication No. 2017/0131129A1, the contents of which are incorporated herein by reference in their entirety.

Unfortunately, the implementation of a droplet based LPP target, such as Tin or Xenon droplets, introduces additional challenges. To reliably stimulate plasma, droplet position stability is critical. For suitable conversion efficiency, the droplets must reach the irradiation location accurately to ensure sufficient coupling between the target material droplet and the focused laser beam. The environment from the nozzle to the irradiation site significantly affects position stability. Important factors include path length, temperature and pressure conditions along the path, and any gas flows along the path. Many of these factors are difficult to control, which leads to suboptimal LPP illumination source performance.

In addition, as a Xenon liquid jet or sequence of droplets travels, a portion of the Xenon evaporates and generates a Xenon gas cloud around the emission site. Xenon gas strongly absorbs EUV/SXR light leading to highly inefficient extraction of useable EUV/SXR light from the LPP light source.

Also, Xenon supply is limited and costly. Xenon is a trace component of the atmosphere (87 parts per billion). A complicated and costly air separation process is required to extract Xenon from the atmosphere. In response, costly recycling equipment is required to recapture as much Xenon as possible from the LPP illumination source environment to minimize Xenon losses.

As a LPP target material, Xenon atoms are highly ionized and excited to various energetic ionic states under electron impact or laser field. One or more buffer gases, such as Argon, Neon, Oxygen, Nitrogen, and Hydrogen, are employed to slow down and eventually stop the energetic Xenon ions to prevent etching of the chamber and optical elements. To recover the Xenon swept away by the buffer gases, the gasses within the LPP chamber are continuously evacuated by vacuum pumps and sent to a rare gas recovery unit. The gas recovery unit separates the Xenon from the buffer gases and purifies the recovered Xenon using one or more gas separation technologies.

Unfortunately, a Xenon gas recovery unit is very costly and does not reach 100% recycling efficiency. The long-term cost of ownership (COO) of a tool utilizing a Xenon gas recovery system can be very significant. FIG. 1 depicts an illustration of the annual cost of ownership due to lost Xenon as a function of nominal flow rate of Xenon for a tool in continuous operation. As illustrated in FIG. 1, the annual cost is plotted for different recovery efficiencies. Plotlines 11, 12, 13, and 14 depict the annual costs associated with recovery efficiencies of 98%, 98.5%, 99%, and 99.5%, respectively. Each of these recovery efficiencies is very difficult to achieve in practice, yet annual costs remain quite high.

Finally, the SXR emission spectrum of Xenon is broadband, similar to other high atomic number elements. The delivery optics employed to extract the SXR illumination from the LPP illumination source and deliver the SXR illumination to a semiconductor wafer are limited in their ability to maintain spectral purity and minimize photon flux loss because SXR optical elements typically trade off photon flux for spectral purity.

In summary, the semiconductor industry continues to shrink device dimensions and increase their complexity. To enable efficient process optimization and yield ramp, new in-line metrology tools are required to provide process developers with accurate structural information in a fast and non-destructive way. X-ray based metrology systems show promise, but improvements to a LPP illumination source employed to provide X-rays to the structures under measurement are desired.

SUMMARY

Methods and systems for generating X-ray illumination from a laser produced plasma employing a liquid sheet jet target are presented herein. In addition, methods and systems for measuring structural and material characteristics (e.g., material composition, dimensional characteristics of structures and films, etc.) of semiconductor structures associated with different semiconductor fabrication processes based on the generated x-ray illumination are also presented.

In some embodiments, the liquid sheet jet LPP light source directs a highly focused, short duration laser source to a liquid sheet jet target including one or more low atomic number elements. The interaction of the focused laser pulse with the sheet jet target ignites a plasma. In some embodiments, the liquid sheet jet LPP light source generates multiple line or broadband X-ray illumination in a soft X-ray (SXR) spectral range, e.g., 10-5,000 electronvolts.

In some embodiments, a liquid sheet jet LPP nozzle is a convergent capillary nozzle including capillary tubes to transport the liquid target material to the exit aperture of the nozzle. In some other embodiments, a liquid sheet jet LPP nozzle is a convergent nozzle that uses an open, planar cavity to transport the liquid target material to an exit aperture of the nozzle.

The liquid sheet jet LPP light source is a compact X-ray source with no moving parts, e.g., no rotating or translating targets. This minimizes the introduction of vibration into the metrology system. A liquid sheet jet target is a very thin (e.g., less than 10 micrometers thick) sheet having a relatively large area of lateral extent (e.g., hundreds of millimeters in two lateral directions). The large lateral area minimizes lateral stability requirements for target positioning because the target area is so large compared to a droplet based target. Similarly, repositioning of the location of the plasma light source is easily achieved by simply controlling the aim of the pump laser beam to relocate the point of incidence to another location of the sheet. In addition, the very thin sheet minimizes plasma debris generation compared to a droplet based target. Finally, the use of low atomic number materials as emission material minimizes cost as there are many low atomic number materials that are abundantly available in the environment (e.g., carbon, oxygen, nitrogen, etc.). Thus, there is no need to employ a costly rare gas recycle system. These materials can either be liquefied and employed in their pure form as a sheet jet target or dissolved in a solvent and employed in a diluted form as the sheet jet target.

In one aspect, RSAXS measurements are performed with x-ray radiation generated by a liquid sheet jet LPP illumination source. X-ray illumination radiation emitted from a liquid sheet jet LPP light source passes through a beamline and is focused onto a semiconductor wafer under measurement.

In another further aspect, a liquid sheet jet LPP light source includes a debris management system including a directed buffer gas flow in the plasma chamber and a vacuum pump to evacuate the buffer gases and any contaminants.

In another further aspect, a liquid sheet jet LPP light source includes a source of magnetic field across a portion of the plasma chamber to drive kinetic ions toward a flow of buffer gas within the plasma chamber. In this manner, the magnetic field facilitates the removal of kinetic ions by driving the kinetic ions into the flow of buffer gas as the buffer gas flows through the plasma chamber toward the vacuum pump employed to exhaust the buffer gas from the plasma chamber.

In a further aspect, a liquid sheet jet LPP light source includes a recycle system that captures and recycles liquid target material.

In another aspect, an x-ray based metrology system includes multiple detectors to separately detect the zero diffracted order and higher diffracted orders. In general, any combination of multiple detectors may be contemplated to detect the zeroth diffraction order and higher diffraction orders.

In another aspect, an x-ray based metrology system includes a multilayer diffractive optical structure in the illumination path to filter the X-ray illumination light. In this manner, the need for a vacuum window in the illumination path is eliminated.

In another aspect, an x-ray based metrology system includes a zone plate structure in the illumination path to refocus excitation light back to the laser produced plasma source. In this manner, radiation that might otherwise be dumped is used to excite the plasma.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

BRIEF DESCRIPTION OF THE DRAWINGS

FIG. 3A is a simplified diagram illustrative of a front view of a liquid sheet jet nozzle in one embodiment.

FIG. 3B is a simplified diagram illustrative of a side view of a liquid sheet jet nozzle in one embodiment.

FIG. 3C is a simplified diagram illustrative of a bottom view of a liquid sheet jet nozzle in one embodiment.

DETAILED DESCRIPTION

Figure 1:
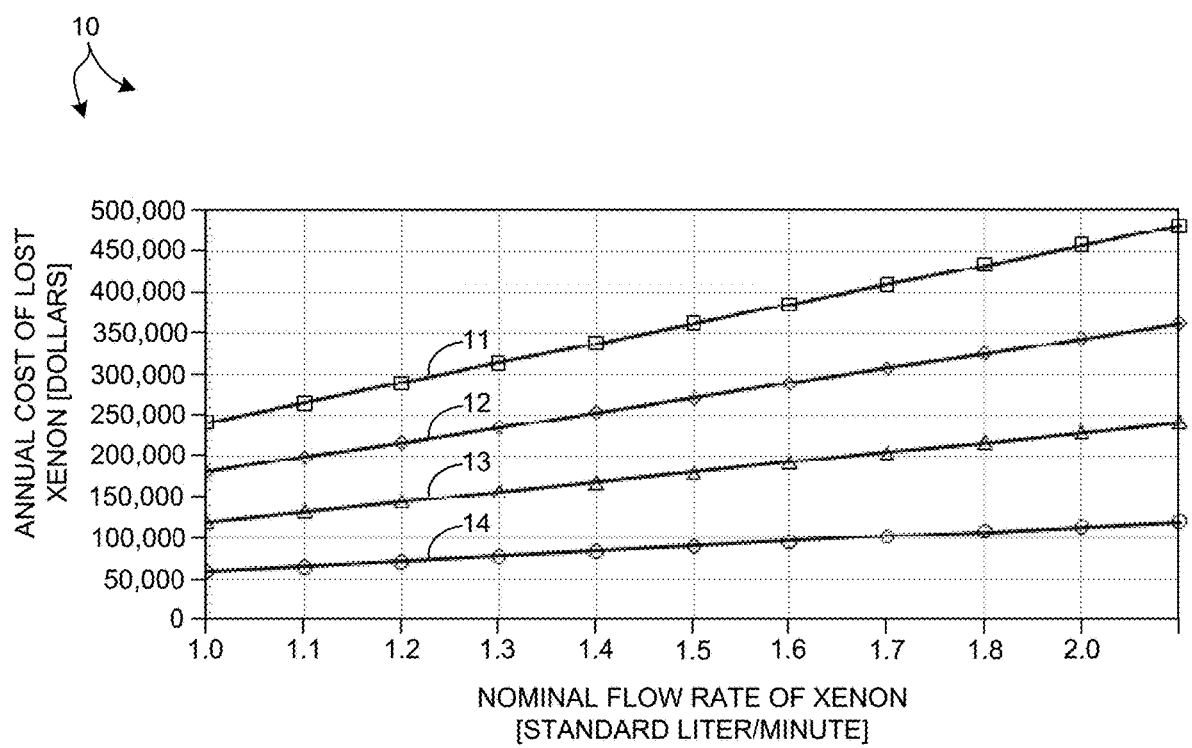
FIG. 1 is a simplified plot illustrative of a cost associated with Xenon lost during continuous operation of a laser produced plasma (LPP) illumination source.

Reference will now be made in detail to background examples and some embodiments of the invention, examples of which are illustrated in the accompanying drawings.

Methods and systems for generating X-ray illumination from a laser produced plasma employing a liquid sheet jet target are presented herein. In addition, methods and systems for measuring structural and material characteristics (e.g., material composition, dimensional characteristics of structures and films, etc.) of semiconductor structures associated with different semiconductor fabrication processes based on the generated x-ray illumination are also presented.

In some embodiments, a laser produced plasma (LPP) light source generates high brilliance (i.e., greater than $10^{13}$ photons/(sec·mm²·mrad²·1% bandwidth)) x-ray illumination. To achieve such high brightness, the LPP light source directs a highly focused, short duration laser source to a liquid sheet jet target including one or more low atomic number elements. The interaction of the focused laser pulse with the sheet jet target ignites a plasma. Radiation from the plasma is collected by collection optics and is directed to a specimen under measurement.

In some embodiments, the liquid sheet jet LPP light source generates multiple line or broadband X-ray illumination in a soft X-ray (SXR) spectral range, e.g., 10-5,000 electronvolts. A SXR spectral range, as defined herein, may include all or portions of a vacuum ultraviolet (VUV) spectral range, an extreme ultraviolet (EUV) spectral range, a soft X-ray range, and a hard X-ray range as defined in other literature. In some embodiments, the liquid sheet jet target includes a relatively low atomic number material, e.g., Z<55, Z<37, or Z<19.

The liquid sheet jet LPP light source is a compact X-ray source with no moving parts, e.g., no rotating or translating targets. This minimizes the introduction of vibration into the metrology system. A liquid sheet jet target is a very thin (e.g., less than 10 micrometers thick) sheet having a relatively large area of lateral extent (e.g., hundreds of millimeters in two lateral directions). The large lateral area minimizes lateral stability requirements for target positioning because the target area is so large compared to a droplet based target. Similarly, repositioning of the location of the plasma light source is easily achieved by simply controlling the aim of the pump laser beam to relocate the point of incidence to another location of the sheet. In addition, the very thin sheet minimizes plasma debris generation compared to a droplet based target. Finally, the use of low atomic number materials as emission material minimizes cost as there are many low atomic number materials that are abundantly available in the environment (e.g., carbon, oxygen, nitrogen, etc.). Thus, there is no need to employ a costly rare gas recycle system. These materials can either be liquefied and employed in their pure form as a sheet jet target or dissolved in a solvent and employed in a diluted form as the sheet jet target.

Figure 2:
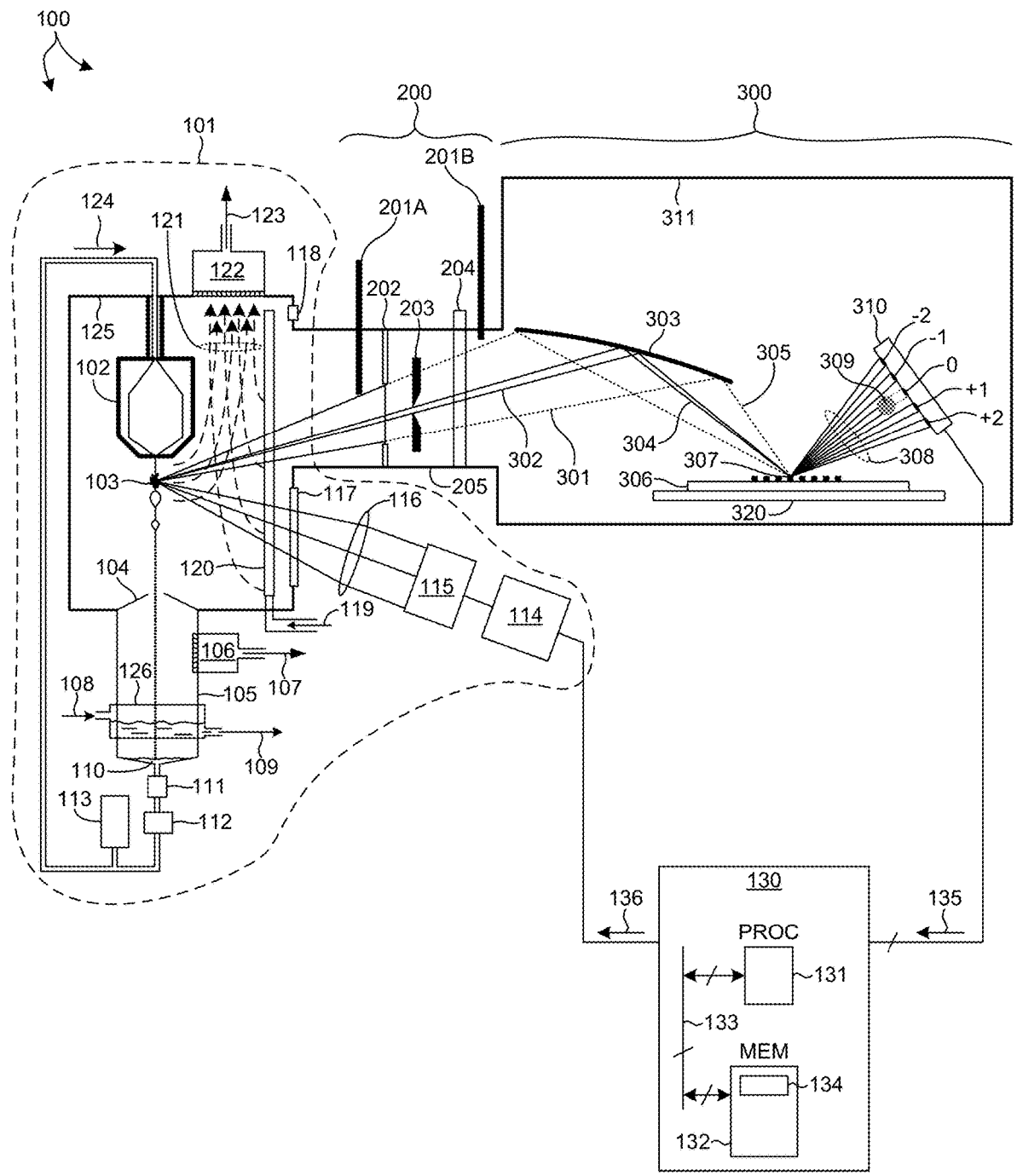
FIG. 2 is a simplified diagram illustrative of an embodiment of a metrology system including a liquid sheet jet LPP X-ray illumination source for measuring characteristics of a specimen in at least one novel aspect.

FIG. 2 depicts an x-ray based metrology system 100 in one embodiment. By way of non-limiting example, x-ray based metrology system 100 is configured as a Reflective, Small-Angle X-ray Scatterometry (RSAXS) system. In some embodiments, RSAXS measurements are performed at one or more wavelengths within the soft x-ray (SXR) region (e.g., 10-5000 eV) at nominal grazing angles of incidence in the range of 1-45 degrees. Grazing angles for a particular measurement application are selected to achieve a desired penetration into the structure under measurement and maximize measurement information content with a small beam spot size (e.g., less than 50 micrometers). An RSAXS system, such as metrology system 100, enables measurement of parameters of interest including critical dimensions, overlay, and edge placement errors. SXR illumination enables overlay measurements on design-rule targets because the illumination wavelength(s) are shorter than the period of the measured structures. This provides a significant benefit over existing technology where overlay is measured on targets that are larger than the design rule. Use of SXR wavelengths permits target design at process design rules, i.e., no "non-zero offsets". In some embodiments, an overlay metrology target for RSAXS measurements may be employed to measure both overlay and critical dimensions. This also enables measurements of Edge Placement Errors (EPE), such as end line shortening, line to contact distance, etc.

In one aspect, RSAXS measurements are performed with x-ray radiation generated by a liquid sheet jet LPP illumination source. As depicted in FIG. 2, x-ray based metrology system 100 includes a liquid sheet jet LPP light source 101, a beamline 200, and a wafer metrology subsystem 300. X-ray illumination radiation emitted from liquid sheet jet LPP light source 101 passes through beamline 200 and is focused onto a semiconductor wafer 306. X-ray radiation is collected from semiconductor wafer 306 in response to the incident X-ray illumination radiation and detected. Estimates of values of one or more parameters of interest characterizing one or more structures 307 disposed on semiconductor wafer 306 are made based on the detected X-ray radiation.

As depicted in FIG. 2, liquid sheet jet LPP light source 101 includes a liquid sheet jet nozzle 102 operating within a plasma chamber 125. A flow 124 of target material is supplied to liquid sheet jet nozzle 102. A number of leaf-shaped sheets of target material are maintained at the output of the liquid sheet jet nozzle. A pulsed laser illumination source 114 emits a sequence of pulses of excitation (pump) light directed toward a sheet of target material maintained by the liquid sheet jet. As depicted in FIG. 2, the excitation light passes through a beam expander 115, one or more focusing optical elements 116, and optical window 117 to reach the sheet jet emitted by nozzle 102. The interaction of a pulse of excitation light with the sheet of target material causes the sheet to ionize to form a plasma 103 that emits an x-ray illumination light with very high brightness. In a preferred embodiment, the brilliance of plasma 103 is greater than $10^{13}$ photons/(sec)·(mm2)·(mrad2)·(1% bandwidth).

Focusing optical element 116 focuses the excitation light onto a sheet of target material over a very small spot size. In some embodiments, the excitation light is focused onto the sheet of target material with a spot size of less than 100 micrometers. In some embodiments, the excitation light is focused onto the sheet of target material with a spot size of less than 20 micrometers. In a preferred embodiment, the excitation light is focused onto the sheet of target material with a spot size of less than 10 micrometers. As the spot size of the excitation light decreases, the spot size of the induced plasma decreases. In some embodiments, the spot size of plasma 103 is less than 400 micrometers. In some embodiments, the spot size of plasma 103 is less than 100 micrometers. In some embodiments, the spot size of plasma 103 is less than 20 micrometers.

In some embodiments, pulsed laser illumination source 114 is a Ytterbium (Yb) based solid state laser. In some other embodiments, pulsed laser illumination source 114 is a Neodymium (Nb) based solid state laser. In some embodiments, pulse laser illumination source 114 is a picosecond laser operating, for example, at a wavelength in the IR range (e.g., 1 micron). In some embodiments, the excitation light has a beam quality factor M2<2.0, a pulse duration in a range from 5 picoseconds to 500 picoseconds, a pulse energy in a range from 10 milliJoules to 500 milliJoules, a peak power in a range from 50 megawatts to 1,000 megawatts, laser intensity at focus maintained at $10^{13}$ W/cm$^2$ or higher, and a contrast ratio greater than 200.

In some embodiments, a liquid sheet jet LPP nozzle is a convergent capillary nozzle including capillary tubes to transport the liquid target material to the exit aperture of the nozzle. FIG. 3A depicts a front view of liquid sheet jet nozzle 102 where the X-direction is horizontal across the drawing page, the Z-direction is vertical up and down the drawing page, and the Y-direction is perpendicular to the drawing page and positive into the drawing page. As depicted in FIG. 3A, liquid sheet jet nozzle 102 includes a nozzle body 143, an inlet orifice 146, and two separate capillary channels 140A and 140B. Liquid target material is received at inlet orifice 146 and flows into both capillary channels 140A and 140B. The capillary channels 140A and 140B are routed away from one another and then return back toward each other at a convergence angle, θ. The terminal ends, i.e., tips, of capillary channels 140A and 140B are located at the exit aperture 145 of liquid sheet jet nozzle 102. The terminal ends of capillary channels 140A and 140B are spaced apart by a small distance, S, in the X-direction.

FIG. 3B depicts a side view of liquid sheet jet nozzle 102 where the Y-direction is horizontal across the drawing page, the Z-direction is vertical up and down the drawing page, and the X-direction is perpendicular to the drawing page and positive out of the drawing page. FIG. 3C depicts a bottom view of liquid sheet jet nozzle 102 where the X-direction is horizontal across the drawing page, the Y-direction is vertical up and down the drawing page, and the Z-direction is perpendicular to the drawing page and positive into the drawing page. As depicted in FIG. 3C, the exit aperture 145 includes the terminal ends of both capillaries 140A and 140B, each having a diameter, D, and spaced apart by a distance, S, in the X-direction.

As liquid target material exits capillary channels 140A and 140B at exit aperture 145, the flows through each capillary channel merge beyond the exit aperture (i.e., outside nozzle 102) to generate a cascading sequence of leaf shaped sheets 141, which ultimately decompose into a sequence of droplets 142. FIGS. 3A and 3B are provided for illustration as the number and scale of leaf shaped sheets depends on the properties of the liquid target material, the flow conditions, the geometry of capillary channels 140A and 140B, and the geometry of exit orifice 145. As illustrated in FIGS. 3A and 3B, the flows through each capillary channel merge to generate leaf shaped sheet 141A of liquid target material oriented in the YZ plane as depicted in FIGS. 3A and 3B. After leaf shaped sheet 141A, the flow transitions to another, smaller leaf shaped sheet 141B oriented in the XZ plane, perpendicular to leaf shaped sheet 141A. After leaf shaped sheet 141B, the flow transitions to yet another, smaller leaf shaped sheet 141C oriented in the YZ plane, perpendicular to leaf shaped sheet 141B. After leaf shaped sheet 141C, the flow transitions to yet another, smaller leaf shaped sheet 141D oriented in the XZ plane, perpendicular to leaf shaped sheet 141C. After leaf shaped sheet 141D, the flow transitions to yet another, smaller leaf shaped sheet 141E oriented in the YZ plane, perpendicular to leaf shaped sheet 141D. After leaf shaped sheet 141E, the flow transitions to a sequence of droplets 142, which are ultimately collected in liquid trap 105 as described with reference to FIG. 2. As depicted in FIGS. 3A and 3B, excitation light 147 is focused onto the first leaf shaped sheet 141A of target material, a distance, B, from the exit aperture 145. In some other embodiments, excitation light 147 is focused onto the second leaf shaped sheet 141B of target material to increase the distance between the plasma location and the exit aperture 145 to prevent fouling exit aperture 145. In general, excitation light 147 may be focused at any distance, B, from the exit aperture 145 at any suitable leaf shaped sheet. In addition, it is preferred to orient the plane of the leaf shaped sheet under illumination in a direction perpendicular to a plane of incidence of excitation light 147.

In general, the leaf shaped structure breaks down as the pulse of excitation light is incident. In several microseconds, e.g., 10 microseconds) after the laser pulse arrives, the leaf shaped structure is reestablished, while a conical sheet and droplet spray obscure the line of sight from the pulsed laser excitation source and sheet jet. After another period of time passes, e.g., 50 microseconds to 500 microseconds, the droplet spray is cleared and the newly formed leaf structure is available for excitation by another pulse of excitation light.

Thinner sheet jets minimize plasma debris, however thinner sheet jets are more difficult to generate and sustain in practice. Thicker sheet jets offer higher conversion efficiency, but as the thickness increases the jet becomes more opaque to X-ray illumination generated within the jet. These losses overtake the conversion efficiency advantage as the thickness becomes greater than a few micrometers, e.g., greater than 10 micrometers.

In general, the overlap between the two flows that merge at the exit aperture ultimately defines the minimum thickness of the sheet. A portion of the flows coalesce to form the thin sheet in the middle of the leaf shaped flow structure, while the portion of the flows that do not coalesce form the perimeter of the leaf shaped flow structure. The edges of the leaf shapes structure are relatively thick compared to the thin film at the center of the leaf shaped structure. Subsequent secondary and higher-order leaf shaped structures form below the primary sheet. These sheets are progressively thicker in the middle and smaller in lateral extent than the first leaf shaped structure. Ultimately, the sheet disintegrates into a droplet spray at the onset of Plateau-Rayleigh instability.

Figure 13A:
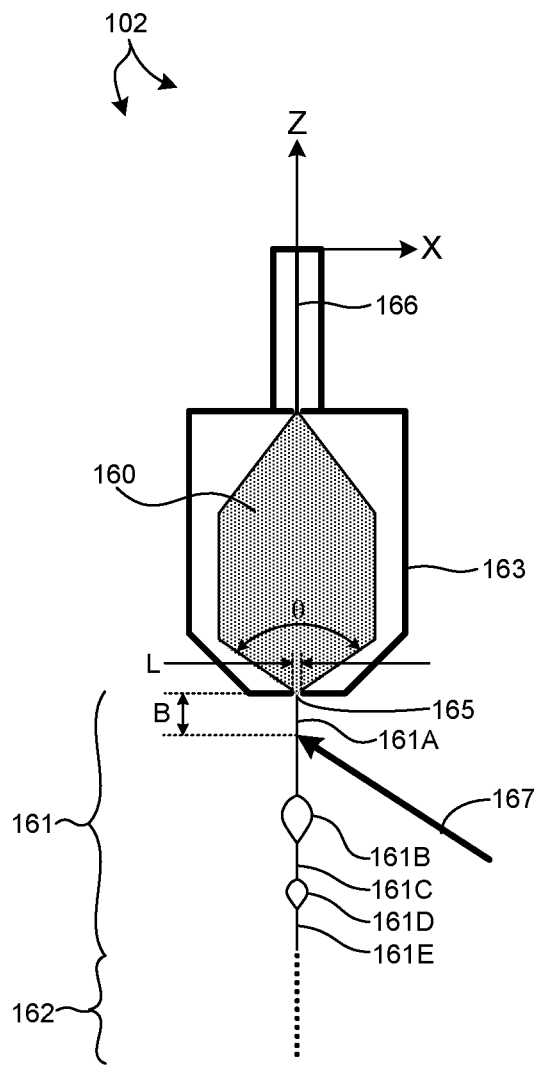
FIG. 13A is a simplified diagram illustrative of a front view of a liquid sheet jet nozzle in another embodiment.

In some other embodiments, a liquid sheet jet LPP nozzle is a convergent nozzle that uses an open, planar cavity to transport the liquid target material to an exit aperture of the nozzle. FIG. 13A depicts a front view of liquid sheet jet nozzle 102 where the X-direction is horizontal across the drawing page, the Z-direction is vertical up and down the drawing page, and the Y-direction is perpendicular to the drawing page and positive into the drawing page. As depicted in FIG. 13A, liquid sheet jet nozzle 102 includes a nozzle body 163, an inlet orifice 166, and a thin, planar cavity, i.e., a chamber having two relatively large lateral dimensions and a relatively small thickness dimension orthogonal to both lateral dimensions. Liquid target material is received at inlet orifice 166 and flows into cavity 160. The cavity is shaped such that after widening in one of the lateral dimensions, it converges toward the bottom of the cavity at a convergence angle, θ. The cavity 160 terminates at an exit orifice 165 having a rectangular shape at the bottom of nozzle 102.

Figure 13B:
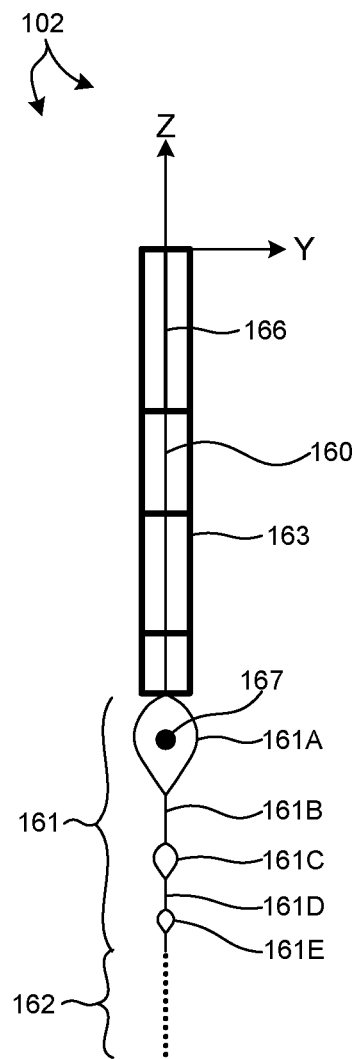
FIG. 13B is a simplified diagram illustrative of a side view of a liquid sheet jet nozzle in another embodiment.
Figure 13C:
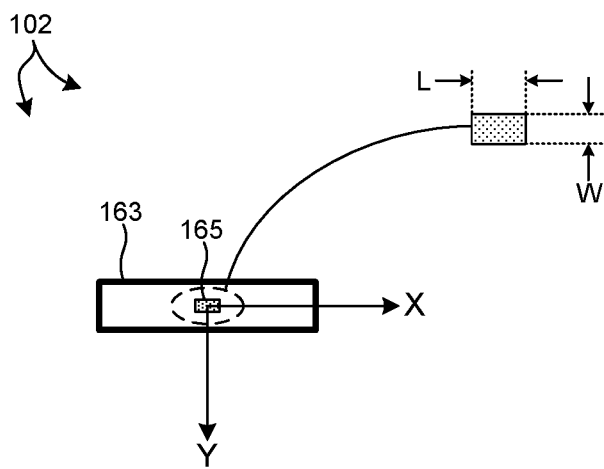
FIG. 13C is a simplified diagram illustrative of a bottom view of a liquid sheet jet nozzle in another embodiment.

FIG. 13B depicts a side view of liquid sheet jet nozzle 102 where the Y-direction is horizontal across the drawing page, the Z-direction is vertical up and down the drawing page, and the X-direction is perpendicular to the drawing page and positive out of the drawing page. FIG. 13C depicts a bottom view of liquid sheet jet nozzle 102 where the X-direction is horizontal across the drawing page, the Y-direction is vertical up and down the drawing page, and the Z-direction is perpendicular to the drawing page and positive into the drawing page. As depicted in FIG. 13C, the exit aperture 165 has width, W, in the Y-direction and a length, L, in the X-direction. In some embodiments, the thickness of cavity 160 is approximately the same as the aperture width, W.

The converging flow of liquid target material exiting exit aperture 145 generates a sequence of leaf shaped sheets 161, which ultimately decompose into a sequence of droplets 162. FIGS. 13A and 13B are provided for illustration as the number and scale of leaf shaped sheets depends on the properties of the liquid target material, the flow conditions, the geometry of cavity 160, and the geometry of exit aperture 165. As illustrated in FIGS. 13A and 13B, the flow through exit aperture 165 generates leaf shaped sheet 161A of liquid target material oriented in the YZ plane as depicted in FIGS. 13A and 13B. After leaf shaped sheet 161A, the flow transitions to another, smaller leaf shaped sheet 161B oriented in the XZ plane, perpendicular to leaf shaped sheet 161A. After leaf shaped sheet 161B, the flow transitions to yet another, smaller leaf shaped sheet 161C oriented in the YZ plane, perpendicular to leaf shaped sheet 161B. After leaf shaped sheet 161C, the flow transitions to yet another, smaller leaf shaped sheet 161D oriented in the XZ plane, perpendicular to leaf shaped sheet 161C. After leaf shaped sheet 161D, the flow transitions to yet another, smaller leaf shaped sheet 161E oriented in the YZ plane, perpendicular to leaf shaped sheet 161D. After leaf shaped sheet 161E, the flow transitions to a sequence of droplets 162, which are ultimately collected in liquid trap 105 as described with reference to FIG. 2. As depicted in FIGS. 13A and 13B, excitation light 147 is focused onto the first leaf shaped sheet 161A of target material, a distance, B, from exit aperture 165. In some other embodiments, excitation light 147 is focused onto the second leaf shaped sheet 161B of target material to increase the distance between the plasma location and the exit aperture 165 to prevent fouling exit aperture 165. In general, excitation light 147 may be focused at any distance, B, from the exit aperture 165 at any suitable leaf shaped sheet. In addition, it is preferred to orient the plane of the leaf shaped sheet under illumination in a direction perpendicular to a plane of incidence of excitation light 147.

For a given target material, the performance of a liquid sheet jet LPP x-ray source depends on several physical parameters. Higher jet speed enables more frequent excitation with the laser source and more light output. However, jet speed is limited by turbulence induced at high flow rates. A larger sheet jet in the lateral dimensions minimizes heat and plasma damage to the nozzle. A thinner sheet jet minimizes vacuum pumping load and debris generated by the plasma. In some embodiments, the linear flow rate of the sheet jet is in a range between 5 and 50 meters/second, distance between exit aperture and incidence of excitation light in a range from 1 centimeter to 10 centimeters, and thickness of the liquid sheet at the location of incidence of the excitation light in a range from 1 micrometer to 5 micrometers. The parameters adjusted to achieve these performance objectives include backing pressure, nozzle geometry, and fluid properties. For a given target material, a fluid property (e.g., viscosity) of the target material is adjusted by controlling the temperature of the liquid in a range from −100 degrees Centigrade to 40 degrees Centigrade. Given reasonable fluid properties and dimensions as described herein, a jet backing pressure in a range from 0.1 bar to 20 bar drives a jet volume flow rate in a range from 10 milliliters/minute to 100 milliliters/minute. Similarly, the convergence angle ranges from 90 to 140 degrees and the width and length of the exit aperture ranges from 20 micrometers to 140 micrometers for a convergent cavity nozzle and the convergence angle ranges from 90 to 140 degrees and the capillary diameter and spacing ranges from 20 micrometers to 140 micrometers for a convergent capillary nozzle.

In general, a liquid sheet jet LPP X-ray illumination source may employ any suitable material or combination of materials as a liquid sheet jet target. However, it is preferred to employ materials comprising elements having relatively low atomic number. In some embodiments, a liquid sheet jet target includes one or more materials each comprising one or more elements each having an atomic number less than 19 (Z<19). In some embodiments, a liquid sheet jet target includes Krypton, Xenon, or both. A liquid sheet jet target is maintained in liquid phase by providing suitable pressure and temperature conditions. In some embodiments, a liquid sheet jet target includes a liquid solvent that maintains another material in solution. In some of these embodiments, the solvent includes one or more materials each comprising one or more elements each having an atomic number less than 19 (Z<19). By way of non-limiting example, suitable sheet jet target materials include Helium, Neon, Argon, Krypton, Xenon, alcohol, water, hydrocarbons, $CO_2$, CO, $N_2$, $O_2$, $F_2$, $H_2O_2$/urea, ammonium hydroxide, sodium hydroxide, magnesium hydroxide, aluminum hydroxide, silicon hydroxide (e.g., hydroxides in form of sodas such as NaOH (caustic soda), $Na_2CO_3$ (washing soda), $NaHCO_3$ (baking soda)), salts (e.g., fluoride salts, chloride salts dissolvable in liquid solvent), and any low atomic number material (Z<19) soluble in a liquid solvent.

Figure 5:
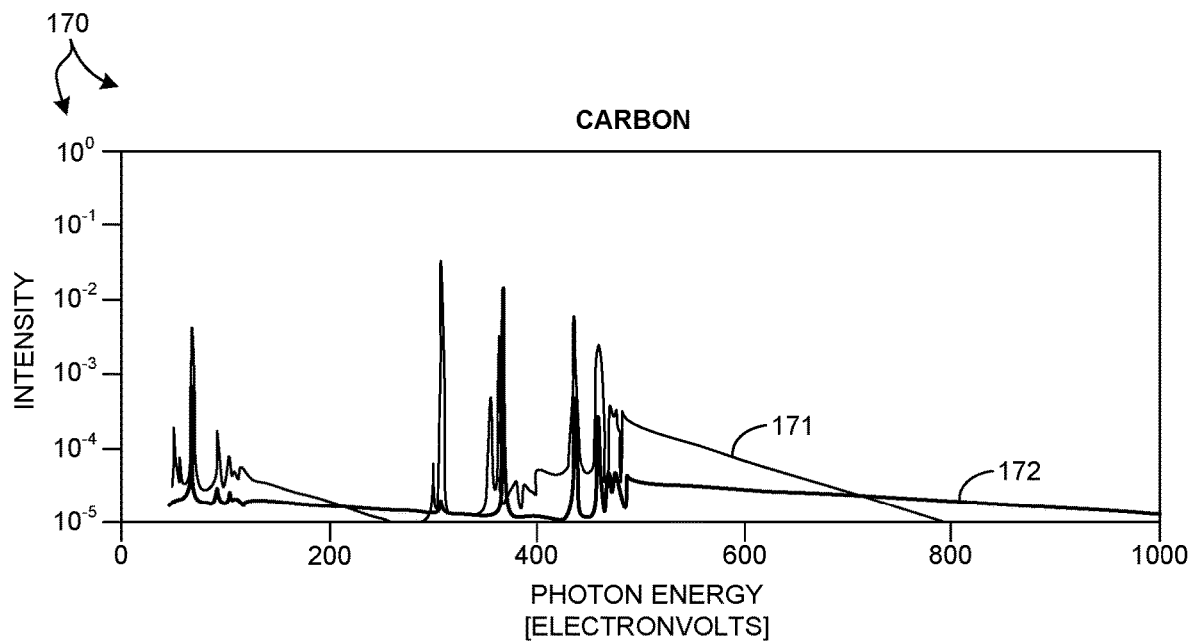
FIG. 5 depicts a plot 170 of simulated emission spectra associated with a LPP X-ray illumination source employing Carbon as a liquid sheet jet target.

FIG. 5 depicts a plot 170 of simulated emission spectra associated with the spectral contribution of Carbon to radiation emitted from a LPP X-ray illumination source employing a target material including Carbon as a component (e.g., $CO_2$). Plotline 171 depicts an emission spectrum associated with a plasma temperature of 100 electronvolts. Plotline 172 depicts an emission spectrum associated with a plasma temperature of 500 electronvolts.

Figure 6:
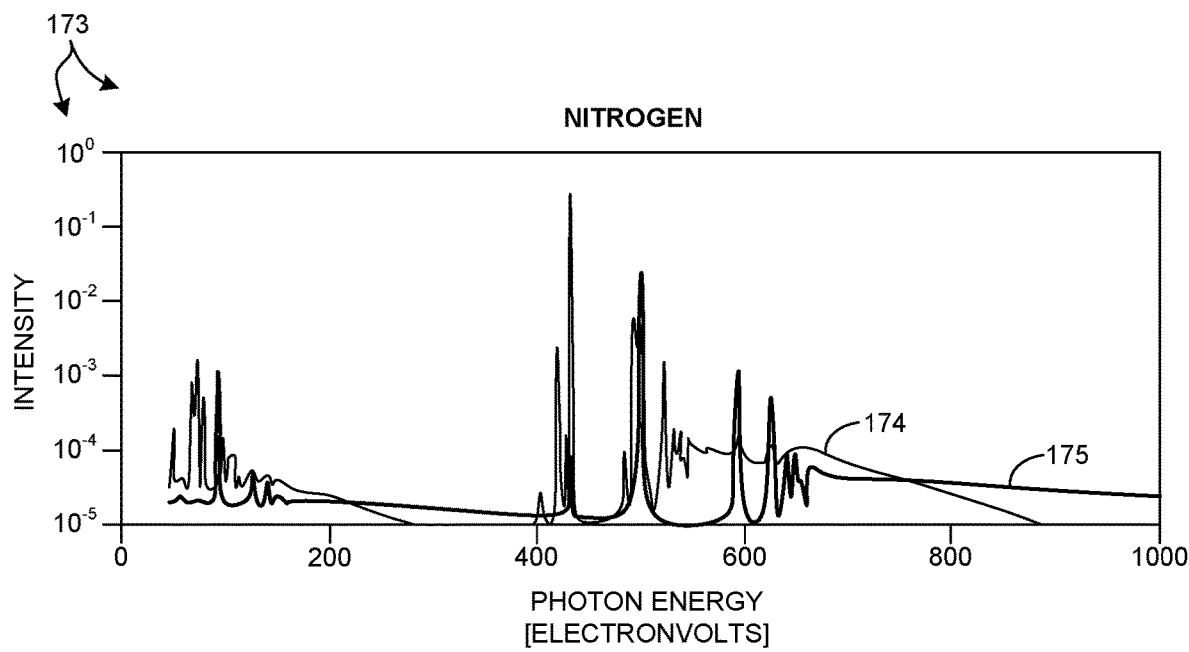
FIG. 6 depicts a plot 173 of simulated emission spectra associated with a LPP X-ray illumination source employing Nitrogen as a liquid sheet jet target.

FIG. 6 depicts a plot 173 of simulated emission spectra associated with the spectral contribution of Nitrogen to radiation emitted from a LPP X-ray illumination source employing a target material including Nitrogen as a component. Plotline 174 depicts an emission spectrum associated with a plasma temperature of 100 electronvolts. Plotline 175 depicts an emission spectrum associated with a plasma temperature of 500 electronvolts.

Figure 7:
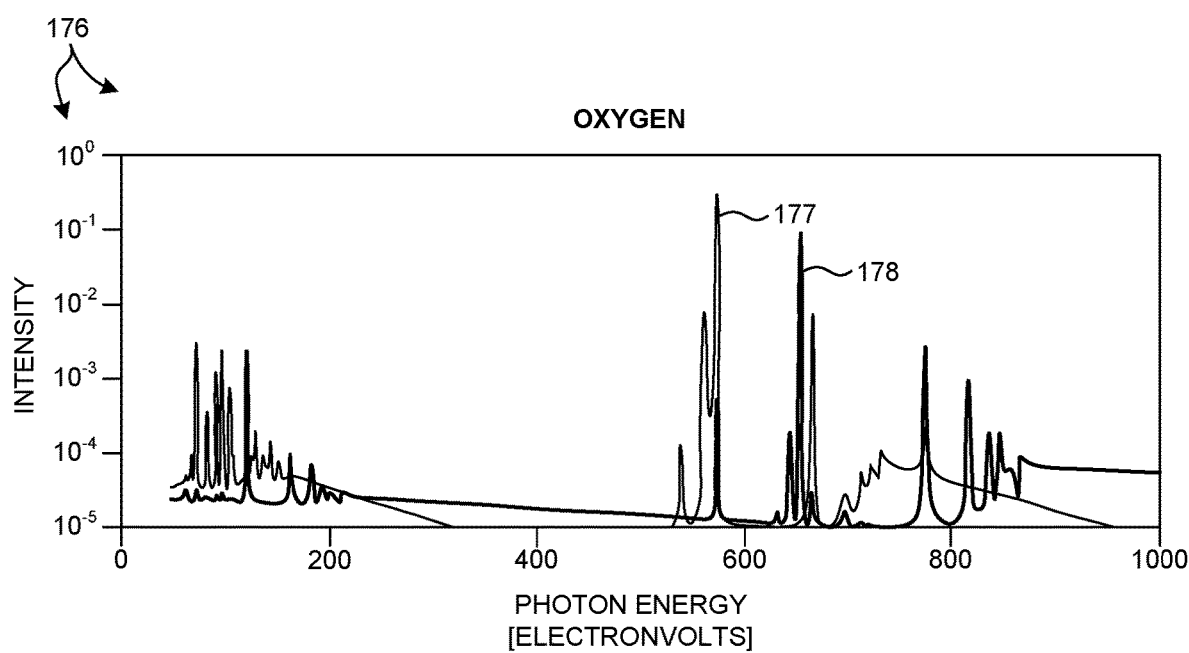
FIG. 7 depicts a plot 176 of simulated emission spectra associated with a LPP X-ray illumination source employing Oxygen as a liquid sheet jet target.

FIG. 7 depicts a plot 176 of simulated emission spectra associated with the spectral contribution of Oxygen to radiation emitted from a LPP X-ray illumination source employing a target material including Oxygen as a component (e.g., $CO_2$). Plotline 177 depicts an emission spectrum associated with a plasma temperature of 100 electronvolts. Plotline 178 depicts an emission spectrum associated with a plasma temperature of 500 electronvolts.

As illustrated in FIGS. 5-7, strong line emissions over a broad range of plasma temperatures are present for all of these low atomic number materials. Furthermore, the line emissions are well within the reflectivity bandwidth of MLM optics. As a result, it is expected that the spectral purity of a low atomic number liquid sheet jet LPP light source should be significantly better compared to an LPP light source employing a Tin based or Xenon based target material.

In another further aspect, a liquid sheet jet LPP light source includes a debris management system including a directed buffer gas flow in the plasma chamber and a vacuum pump to evacuate the buffer gases and any contaminants. As depicted in FIG. 2, plasma chamber 125 includes one or more walls that contain a flow of buffer gas 121 within the plasma chamber. The buffer gas stops high kinetic energy ions and neutrals from depositing on sensitive optical elements in proximity to plasma 103. As depicted in FIG. 2, a flow of buffer gas 119 is distributed within plasma chamber 125 by one or more gas cones 120. In some embodiments, each gas cone 120 directs high-speed longitudinal gas flow toward the source of the debris, i.e., plasma 103, to prevent debris from reaching one or more optical elements. In some embodiments, one or more gas cones are placed before window 117, beamline 200, and flux monitor 118. In some embodiments, a flow of buffer gas is provided around the location of plasma 103 to promote flow of contaminants away from the immediate vicinity of plasma 103. Additional description of debris mitigation techniques including gas cones is provided in U.S. Pat. No. 10,101,664, the content of which is incorporated herein by reference in its entirety. As depicted in FIG. 2, a vacuum pump 122 is employed to evacuate the flow of contaminated buffer gas 121 from plasma chamber 125. The evacuated materials 123 are exhausted from the system without the need to recycle buffer gas material or target material evacuated by vacuum pump 122 because these materials are low cost.

Figure 4:
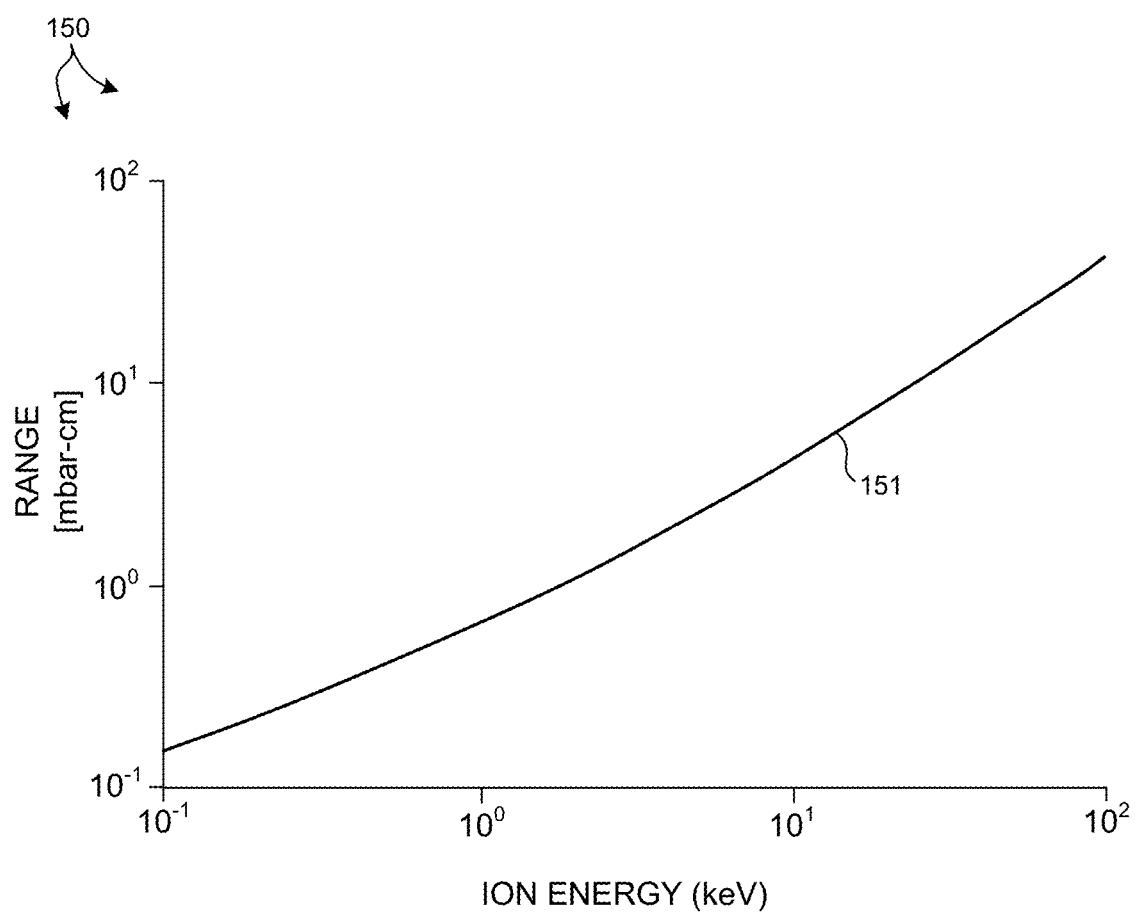
FIG. 4 is a plot 150 illustrative of a simulation of the stopping range of oxygen ions in nitrogen ($N_2$) gas as a function of energy of the oxygen ions.

FIG. 4 depicts a plot 150 illustrative of the stopping range of oxygen ions in nitrogen ($N_2$) gas as a function of energy of the oxygen ions. Plotline 151 depicts the average stopping range associated with stopping each of an ensemble of oxygen ions at the each ion energy.

As illustrated in FIG. 4, oxygen ions having an initial kinetic energy, i.e., ion energy, of 30 kiloelectronvolts require a stopping range of 30 millibar-centimeters in a nitrogen buffer gas. For example, nitrogen buffer gas maintained at 3 millibars will stop oxygen ions having initial kinetic energy up to 30 kiloelectronvolts over a path length of 10 centimeters with high probability. In some embodiments, a distance between a window of the plasma chamber 125 and the plasma 103 is at least 10 centimeters.

In another further aspect, a liquid sheet jet LPP light source includes a source of magnetic field across a portion of the plasma chamber to drive kinetic ions toward a flow of buffer gas within the plasma chamber. In this manner, the magnetic field facilitates the removal of kinetic ions by driving the kinetic ions into the flow of buffer gas as the buffer gas flows through the plasma chamber toward the vacuum pump employed to exhaust the buffer gas from the plasma chamber. In some examples a set of permanent magnets, electromagnets, etc., is disposed across the field of buffer gas flow to generate the magnetic field that drives the ions into the flow of buffer gas before evacuation.

In a further aspect, a liquid sheet jet LPP light source includes a recycle system that captures and recycles liquid target material. FIG. 2 depicts a liquid trap 105 located at the bottom of plasma chamber 125. Liquid trap 105 includes an inlet orifice 104. After the liquid sheet jet decomposes into a liquid stream or sequence of droplets, the liquid target material enters liquid trap 105 through inlet orifice 104. Liquid trap 105 is pumped by a vacuum pump 106, e.g., a turbo pump, to exhaust vapors 107 generated by evaporation from the liquid target material. Vacuum pump 106 prevents pressure from building within liquid trap 105 that might prevent the liquid target material from entering inlet orifice 104. A cryogenic cooler 126 is located near the bottom of liquid trap 105 to chill the liquid target material an minimize evaporative losses. Coolant 108 flows into cryogenic cooler 125, where it absorbs heat and exits the cooler as coolant flow 109 at higher temperature. In some examples, cryogenic cooler 125 maintains the liquid target material at a temperature that is at least 100 degrees Centigrade less than room temperature. The trapped liquid target material 110 pools at the bottom of liquid trap 105 where it is drained from the bottom of the liquid trap 105. The liquid target material passes through a filter 111 and is pressurized by a high performance liquid chromatography (HPLC) pump 112. A pulse damper 113 is located near the output of HPLC pump 112 to remove any high frequency pressure ripple that might be introduced by the HPLC pump 112. A flow of pressurized liquid target material 124 is then delivered at the input of liquid sheet jet nozzle 102.

As depicted in FIG. 2, X-ray illumination light emitted by plasma 103 exits plasma chamber 125, passes through beamline 200 and enters wafer metrology subsystem 300. In general, the X-ray illumination path from plasma 103 to wafer 306 includes many illumination controlling elements to shape, direct, and filter the X-ray illumination light. In some embodiments, an energy filter is included in the illumination path to select the desired beam energy. In some embodiments, one or more optical elements are located in the illumination path to control beam divergence, angle of incidence, azimuth angle, or any combination thereof. In some embodiments, a vacuum window is located in the illumination path to separate the environment of the plasma chamber 125 from the environment of the wafer metrology subsystem 300. In some of these embodiments, the vacuum window material, one or more films deposited on the vacuum window, or both, are selected to filter the energy of the X-ray illumination light passing through the vacuum window. In some embodiments, one or more optical elements are located in the illumination path to magnify or de-magnify the X-ray illumination light beam. In some embodiments, a diffraction grating structure is fabricated on a surface of one or more illumination optical elements to enhance the spectral purity of the X-ray illumination light.

In the embodiment depicted in FIG. 2, X-ray illumination light emitted by plasma 103 enters beamline 200 and passes through pneumatic gate valve 201A, vacuum window 202, aperture system 203, vacuum window monitoring and safety device 204, and pneumatic gate valve 201B. Pneumatic gate valves 201A and 201B are located on either end of beamline 200. During metrology system operation, the pneumatic gate valves 201A and 201B remain open. However, in situations where isolation between the plasma chamber 125 and the metrology chamber 311 is desired, one or more of pneumatic gate valves 201A and 201B are closed. When both pneumatic gate valves 201A and 201B are closed, a beamline chamber, environmentally isolated from both the plasma chamber 125 and the metrology chamber 311, is formed.

In the embodiment depicted in FIG. 2, a vacuum window 202 is located in the illumination path between pneumatic gate valves 201A and 201B to separate the vacuum environment of the plasma chamber 125 from the metrology chamber 311. In one embodiment, the vacuum window 202 includes a thin coating to block infrared wavelengths generated by the pulsed laser illumination source 114 from reaching metrology subsystem 300.

Aperture system 203 controls the x-ray illumination beam numerical aperture, nominal grazing angle of incidence (AOI), and azimuth angle at wafer 306. In some embodiments, aperture system 203 is a four blade programmable aperture device. In some embodiments, computing system 130 communicated control commands (not shown) to aperture system 203 to control the position of each of the four blades with respect to the X-ray illumination beam to achieve a desired beam numerical aperture, nominal grazing angle of incidence (AOI), and azimuth angle at wafer 306.

In general, an RSAX metrology system (e.g., metrology system 100) includes one or more beam slits or apertures to shape the x-ray illumination beam incident on wafer 306 and selectively block a portion of illumination light that would otherwise illuminate a metrology target under measurement. One or more beam slits define the beam size and shape such that the x-ray illumination spot fits within the area of the metrology target under measurement. In addition, one or more beam slits define illumination beam divergence to minimize overlap of diffraction orders on the detector.

As illustrated in FIG. 2, a vacuum window monitoring and safety device 204 is located across beamline 200 between vacuum window 202 and metrology chamber 300. Vacuum window monitoring and safety device 204 monitors the integrity of vacuum window 202. If vacuum window 202 mechanically fails, i.e., shatters or otherwise fractures into one or more pieces, the vacuum window monitoring and safety device 204 quickly closes the space across beam line 200 to capture any fragments of vacuum window 202 and prevent fragments from contaminating metrology chamber 300. In some embodiments, vacuum window monitoring and safety device 204 includes a fast mechanical shutter or pneumatic actuator to quickly close any space across beamline 200. In some embodiments, activation of vacuum window monitoring and safety device 204 also triggers pneumatic gate valves 201A and 201B to close to offer additional protection. However, due to relatively large mass, it may require more time for pneumatic gate vales 201A and 201B to fully close and isolate the beamline chamber.

In the embodiment depicted in FIG. 2, X-ray illumination light entering metrology subsystem 300 from beamline 200 is incident on ellipsoid mirror 303. In some embodiments, ellipsoid mirror 303 images the X-ray illumination source spot onto a metrology target 307 disposed on wafer 306 with a de-magnification factor in a range from 0.5 to 0.1 (i.e., project an image of the source onto the wafer that is ½ to 1/10 the source size). In one embodiment, an RSAXS system as described herein employs an X-ray illumination source having a source area characterized by a lateral dimension of 20 micrometers or less (i.e., source size is 20 micrometers or smaller) and a focusing mirror having a de-magnification factor of 0.1. In this embodiment, the focusing mirror projects illumination onto wafer 306 with an incident illumination spot size of two micrometers or less.

The X-ray illumination source spot is located at one foci of ellipsoid mirror 303 and metrology target 307 is located at another foci of ellipsoid mirror 303. Ellipsoid mirror 303 includes a Membrane-mirror Light Modulator (MLM) with graded thickness to compensate for the change of grazing angle of incidence across the surface of ellipsoid mirror 303. The clear aperture of ellipsoid mirror 303 defines the maximum Numerical Aperture (NA) 301 from the X-ray illumination source spot and the maximum NA 305 to wafer 306. By control of aperture system 203, the grazing AOI, NA, and azimuth angle to wafer 306 may be scanned within the maximum NA cone 305. For example, FIG. 2 illustrates NA 304 within maximum NA cone 305.

In general, focusing optics such as elliptical mirror 303 collect source emission and select one or more discrete wavelengths or spectral bands, and focus the selected light onto wafer 306 at nominal grazing angles of incidence in the range 1-45 degrees.

In some embodiments, the focusing optics include graded multi-layers that select desired wavelengths or ranges of wavelengths for projection onto wafer 306. In some examples, focusing optics include a graded multi-layer structure (e.g., layers or coatings) that select one wavelength and project the selected wavelength onto wafer 306 over a range of angles of incidence. In some examples, focusing optics include a graded multi-layer structure that selects a range of wavelengths and projects the selected wavelengths onto wafer 306 over one angle of incidence. In some examples, focusing optics include a graded multi-layer structure that selects a range of wavelengths and projects the selected wavelengths onto wafer 306 over a range of angles of incidence.

Graded multi-layered optics are preferred to minimize loss of light that occurs when single layer grating structures are too deep. In general, multi-layer optics select reflected wavelengths. The spectral bandwidth of the selected wavelengths optimizes flux provided to wafer 306, information content in the measured diffracted orders, and prevents degradation of signal through angular dispersion and diffraction peak overlap at the detector. In addition, graded multi-layer optics are employed to control divergence. Angular divergence at each wavelength is optimized for flux and minimal spatial overlap at the detector.

In some examples, graded multi-layer optics select wavelengths to enhance contrast and information content of diffraction signals from specific material interfaces or structural dimensions. For example, the selected wavelengths may be chosen to span element-specific resonance regions (e.g., Silicon K-edge, Nitrogen, Oxygen K-edge, etc.). In addition, in these examples, the illumination source may also be tuned to maximize flux in the selected spectral region (e.g., HHG spectral tuning, LPP laser tuning, etc.)

In the embodiment depicted in FIG. 2, X-ray based metrology system 100 includes a wafer positioning system 320 to position and orient wafer 306 with respect to the incident X-ray illumination. In some embodiments, wafer positioning system 320 is configured to rotate wafer 306 to perform angle resolved measurements of wafer 306 over any number of locations on the surface of wafer 306. In one example, computing system 130 communicates command signals (not shown) to a motion controller of wafer positioning system 320 that indicate the desired position and orientation of wafer 306. In response, the motion controller generates command signals to the various actuators of wafer positioning system 320 to achieve the desired position and orientation of wafer 306.

In some embodiments, metrology system 100 includes one or more collection optical elements that collect light from wafer 306 and direct at least a portion of the collected light to detector 310. In some embodiments, one or more aperture elements, e.g., slits, are located in the x-ray collection path to block some of the reflected light, one or more diffracted orders. In some embodiments, one or more spatial attenuators are located in the collection path to selectively attenuate (i.e., reduce the intensity) some of the reflected light, e.g., selectively reduce the intensity of one or more diffracted orders. In the embodiment depicted in FIG. 2, a spatial attenuator 309 is located in a portion of the collection path associated with the zeroth order. In this manner, spatial attenuator 309 equalizes the intensity of the zeroth diffracted order and the higher diffraction orders before detection by detector 310. It may be advantageous to attenuate the intensity of the zeroth order relative to higher diffracted orders to avoid saturating detector 310 when the intensity of the zeroth order is significantly greater than any of the higher diffracted orders. In other embodiments, a beam block is employed to block the zero order to prevent undesirable flare across the photosensitive surface of the detector due to strong zero order reflection.

Metrology system 100 also includes one or more detectors to measure the intensity, energy, wavelength, etc., associated with the diffracted orders. In some embodiments, detector 310 detects diffracted light at multiple wavelengths and angles of incidence. In some embodiments, the position, orientation, or both, of detector 310 is controlled to capture diffracted light from metrology target 307.

As depicted in FIG. 2, X-ray detector 310 detects x-ray radiation scattered from wafer 306 and generates output signals 135 indicative of properties of wafer 306 that are sensitive to the incident x-ray radiation in accordance with a RSAXS measurement modality. In some embodiments, scattered x-rays are collected by x-ray detector 310 while specimen positioning system 320 locates and orients wafer 306 to produce angularly resolved scattered x-rays.

In some embodiments, a RSAXS system includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 310 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 135 for further processing and storage.

Diffraction patterns resulting from simultaneous illumination of a periodic target with multiple illumination wavelengths are separated at the detector plane due to angular dispersion in diffraction. In these embodiments, integrating detectors are employed. The diffraction patterns are measured using area detectors, e.g., vacuum-compatible backside CCD or hybrid pixel array detectors. Angular sampling is optimized for Bragg peak integration. If pixel level model fitting is employed, angular sampling is optimized for signal information content. Sampling rates are selected to prevent saturation of zero order signals.

In a further aspect, a RSAXS system is employed to determine properties of a specimen (e.g., structural parameter values) based on one or more diffraction orders of scattered light. As depicted in FIG. 2, metrology system 100 includes a computing system 130 employed to acquire signals 135 generated by detector 310 and determine properties of wafer 306 based at least in part on the acquired signals 135.

In some examples, metrology based on RSAXS involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

In some examples, it is desirable to perform measurements at large ranges of wavelength, angle of incidence and azimuth angle to increase the precision and accuracy of measured parameter values. This approach reduces correlations among parameters by extending the number and diversity of data sets available for analysis.

Measurements of the intensity of diffracted radiation as a function of illumination wavelength and x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

In another further aspect, computing system 130 is configured to generate a structural model (e.g., geometric model, material model, or combined geometric and material model) of a measured structure of a specimen, generate a x-ray scatterometry response model that includes at least one geometric parameter from the structural model, and resolve at least one specimen parameter value by performing a fitting analysis of x-ray scatterometry measurement data with the x-ray scatterometry response model. The analysis engine is used to compare the simulated x-ray scatterometry signals with measured data thereby allowing the determination of geometric as well as material properties such as electron density of the sample. In the embodiment depicted in FIG. 2, computing system 130 is configured as a model building and analysis engine configured to implement model building and analysis functionality as described herein.

Figure 8:
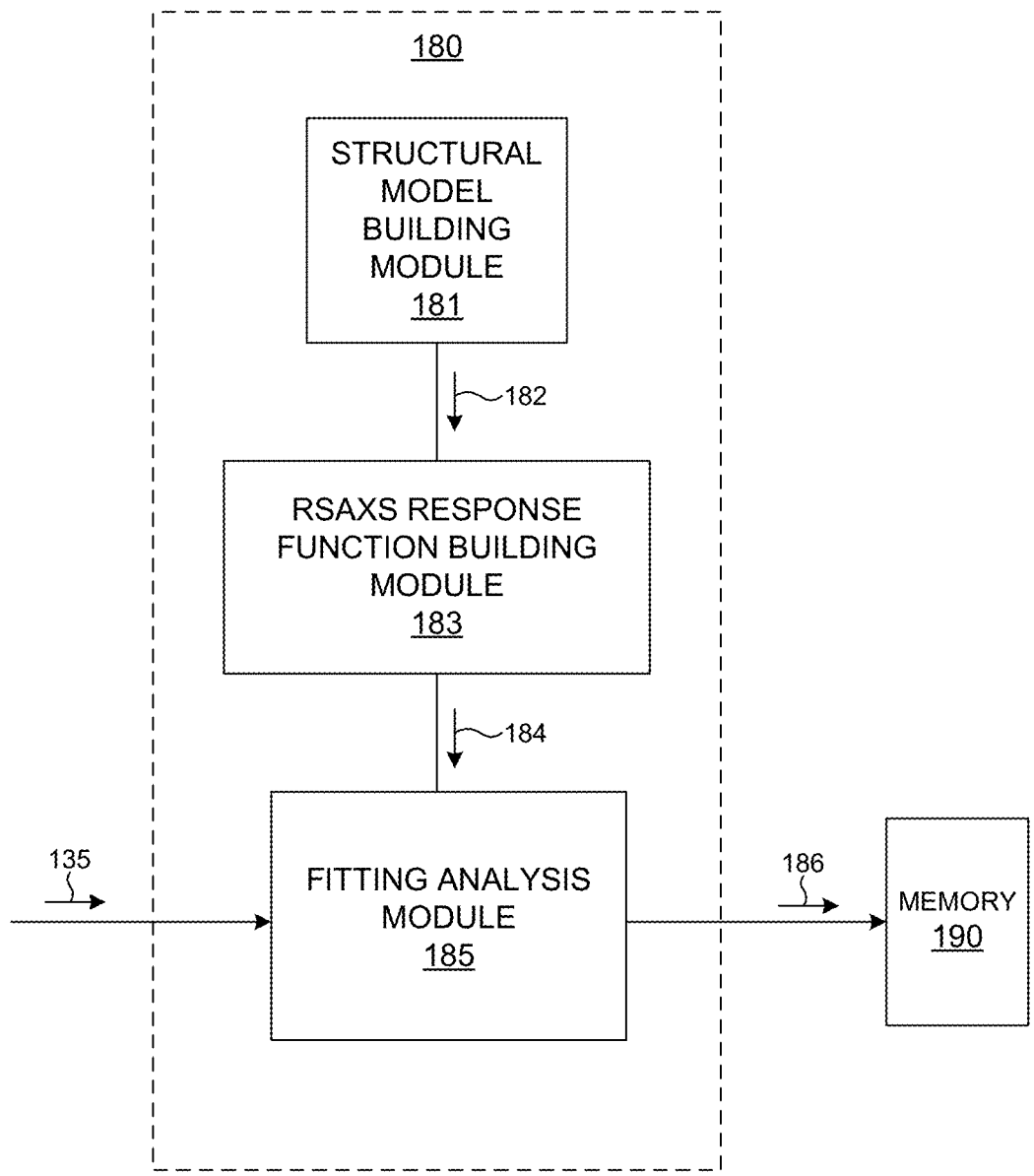
FIG. 8 is a simplified diagram illustrative of an exemplary model building and analysis engine.

FIG. 8 is a diagram illustrative of an exemplary model building and analysis engine 180 implemented by computing system 130. As depicted in FIG. 8, model building and analysis engine 180 includes a structural model building module 181 that generates a structural model 182 of a measured structure of a specimen. In some embodiments, structural model 182 also includes material properties of the specimen. The structural model 182 is received as input to RSAXS response function building module 183. RSAXS response function building module 183 generates a RSAXS response function model 184 based at least in part on the structural model 182. In some examples, the RSAXS response function model 184 is based on x-ray form factors, also known as structure factors, $$F(\vec{q}) = \int \rho(\vec{r}) e^{-i\vec{q}\cdot\vec{r}} d\vec{r} \quad (2)$$

where F is the form factor, q is the scattering vector, and $\rho(r)$ is the electron density of the specimen in spherical coordinates. The x-ray scattering intensity is then given by $$I(\vec{q}) = F^*F. \quad (3)$$

RSAXS response function model 184 is received as input to fitting analysis module 185. The fitting analysis module 185 compares the modeled RSAXS response with the corresponding measured data to determine geometric as well as material properties of the specimen.

In some examples, the fitting of modeled data to experimental data is achieved by minimizing a chi-squared value. For example, for RSAXS measurements, a chi-squared value can be defined as $$\chi^2_{SAXS} = \frac{1}{N_{SAXS}} \Sigma_j^{N_{SAXS}} \frac{\left(S_j^{SAXS\ model}(v_1, \ldots, v_L) - s_j^{SAXS\ experiment}\right)^2}{\sigma^2_{SAXS,j}} \quad (4)$$

Where, $S_j^{SAXS\ experiment}$ is the measured RSAXS signals 126 in the "channel" j, where the index j describes a set of system parameters such as diffraction order, energy, angular coordinate, etc. $S_j^{SAXS\ model}/v_1, \ldots, v_L$ is the modeled RSAXS signal $S_j$ for the "channel" j, evaluated for a set of structure (target) parameters $v_1, \ldots, v_L$, where these parameters describe geometric (CD, sidewall angle, overlay, etc.) and material (electron density, etc.). $\sigma_{SAXS,j}$ is the uncertainty associated with the jth channel. $N_{SAXS}$ is the total number of channels in the x-ray metrology. L is the number of parameters characterizing the metrology target.

Equation (4) assumes that the uncertainties associated with different channels are uncorrelated. In examples where the uncertainties associated with the different channels are correlated, a covariance between the uncertainties, can be calculated. In these examples a chi-squared value for RSAXS measurements can be expressed as $$\chi^2_{SAXS} = \frac{1}{N_{SAXS}} \left(\vec{S}_j^{SAXS\bullet model}(v_1, \ldots, v_M) - \vec{S}_j^{SAXS\bullet experiment}\right)^T \quad (5)$$
$$V_{SAXS}^{-1}\left(\vec{S}_j^{SAXS\bullet model}(v_1, \ldots, v_M) - \vec{S}_j^{SAXS\bullet experiment}\right)$$

where, $V_{SAXS}$ is the covariance matrix of the SAXS channel uncertainties, and T denotes the transpose.

In some examples, fitting analysis module 185 resolves at least one specimen parameter value by performing a fitting analysis on RSAXS measurement data 135 with the RSAXS response model 184. In some examples, $\chi^2_{SAXS}$ is optimized.

As described hereinbefore, the fitting of RSAXS data is achieved by minimization of chi-squared values. However, in general, the fitting of RSAXS data may be achieved by other functions.

The fitting of RSAXS metrology data is advantageous for any type of RSAXS technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing RSAXS beam interaction with the specimen are used.

In general, computing system 130 is configured to access model parameters in real-time, employing Real Time Critical Dimensioning (RTCD), or it may access libraries of pre-computed models for determining a value of at least one specimen parameter value associated with the specimen 101. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In some examples, model building and analysis engine 180 improves the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

In another further aspect, an initial estimate of values of one or more parameters of interest is determined based on RSAXS measurements performed at a single orientation of the incident x-ray beam with respect to the measurement target. The initial, estimated values are implemented as the starting values of the parameters of interest for a regression of the measurement model with measurement data collected from RSAXS measurements at multiple orientations. In this manner, a close estimate of a parameter of interest is determined with a relatively small amount of computational effort, and by implementing this close estimate as the starting point for a regression over a much larger data set, a refined estimate of the parameter of interest is obtained with less overall computational effort.

In a further aspect, RSAXS measurement data is used to generate an image of a measured structure based on the measured intensities of the detected diffraction orders. In some embodiments, a RSAXS response function model is generalized to describe the scattering from a generic electron density mesh. Matching this model to the measured signals, while constraining the modelled electron densities in this mesh to enforce continuity and sparse edges, provides a three dimensional image of the sample.

Although, geometric, model-based, parametric inversion is preferred for critical dimension (CD) metrology based on RSAXS measurements, a map of the specimen generated from the same RSAXS measurement data is useful to identify and correct model errors when the measured specimen deviates from the assumptions of the geometric model.

In some examples, the image is compared to structural characteristics estimated by a geometric, model-based parametric inversion of the same scatterometry measurement data. Discrepancies are used to update the geometric model of the measured structure and improve measurement performance. The ability to converge on an accurate parametric measurement model is particularly important when measuring integrated circuits to control, monitor, and trouble-shoot their manufacturing process.

In some examples, the image is a two dimensional (2-D) map of electron density, absorptivity, complex index of refraction, or a combination of these material characteristics. In some examples, the image is a three dimensional (3-D) map of electron density, absorptivity, complex index of refraction, or a combination of these material characteristics. The map is generated using relatively few physical constraints. In some examples, one or more parameters of interest, such as critical dimension (CD), sidewall angle (SWA), overlay, edge placement error, pitch walk, etc., are estimated directly from the resulting map. In some other examples, the map is useful for debugging the wafer process when the sample geometry or materials deviate outside the range of expected values contemplated by a parametric structural model employed for model-based CD measurement. In one example, the differences between the map and a rendering of the structure predicted by the parametric structural model according to its measured parameters are used to update the parametric structural model and improve its measurement performance. Further details are described in U.S. Patent Publication No. 2015/0300965, the content of which is incorporated herein by reference it its entirety. Additional details are described in U.S. Patent Publication No. 2015/0117610, the content of which is incorporated herein by reference it its entirety.

In a further aspect, model building and analysis engine 180 is employed to generate models for combined x-ray and optical measurement analysis. In some examples, optical simulations are based on, e.g., rigorous coupled-wave analysis (RCWA) where Maxwell's equations are solved to calculate optical signals such as reflectivities for different polarizations, ellipsometric parameters, phase change, etc.

Values of one or more parameters of interest are determined based on a combined fitting analysis of the detected intensities of the x-ray diffraction orders at the plurality of different angles of incidence and detected optical intensities with a combined, geometrically parameterized response model. The optical intensities are measured by an optical metrology tool that may or may not be mechanically integrated with an x-ray metrology system, such as system 100 depicted in FIG. 2. Further details are described in U.S. Patent Publication No. 2014/0019097 and U.S. Patent Publication No. 2013/0304424, the contents of each are incorporated herein by reference it their entirety.

Figure 9:
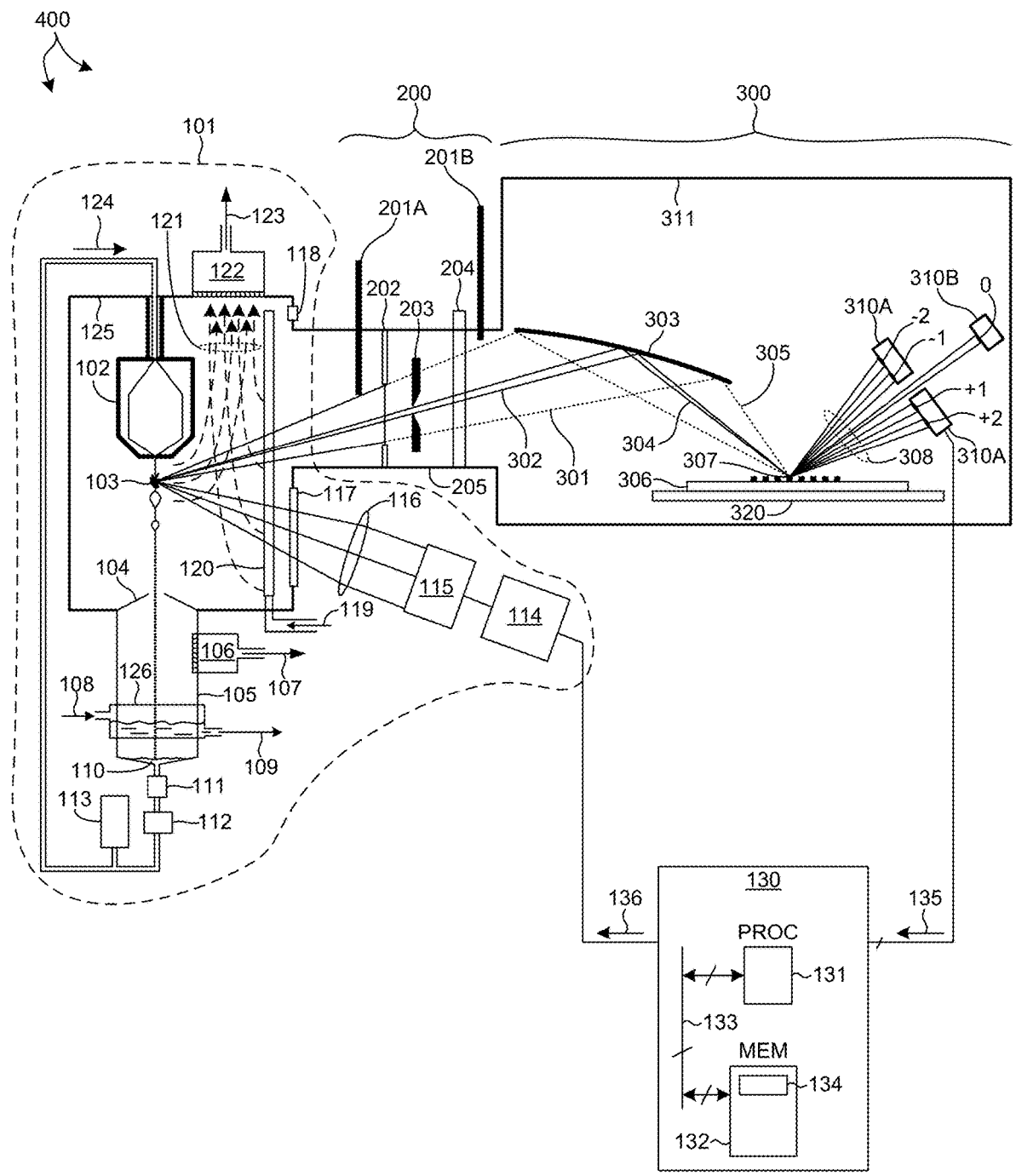
FIG. 9 is a simplified diagram illustrative of another embodiment of a metrology system including a liquid sheet jet LPP X-ray illumination source for measuring characteristics of a specimen in at least one novel aspect.

In another aspect, an x-ray based metrology system includes multiple detectors to separately detect the zero diffracted order and higher diffracted orders. FIG. 9 depicts an x-ray based metrology system 400 in another embodiment. Like numbered elements depicted in FIG. 9 are analogous to those described with reference to FIG. 2.

As depicted in FIG. 9, wafer metrology subsystem 300 includes detectors 310A and 310B. Detector 310A is located in the collection path of diffracted orders greater than zero. Detector 310B is located in the collection path of the zeroth diffracted order. In this manner, the risk of contaminating the measurement of higher orders by signal spillover from the zeroth order is minimized. In some other embodiments, three detectors might be employed: one to detect the zero order, another to collect positive, non-zero orders, and another to collect negative, non-zero orders. In general, any combination of multiple detectors may be contemplated to detect the zeroth diffraction order and higher diffraction orders.

The embodiment described with reference to FIG. 2 includes a vacuum window 202 to filter the X-ray illumination and separate the vacuum environments of the plasma chamber 125 and the wafer metrology chamber 311. Vacuum window 202 must be fabricated from very thin material layers to minimize absorption of desirable X-ray illumination light and maximize absorption of undesirable infrared light from the pulsed laser illumination source (pump excitation source) 114. The thermal load on vacuum window 202 due to absorption of radiation is significant. In addition, vacuum window 202 must also be mechanically strong and stable to withstand the pressure difference between plasma chamber 125 and the wafer metrology chamber 311. A mechanical failure of vacuum window 202 threatens the integrity of both the plasma chamber 125 and the wafer metrology chamber 311. In practice, it can be difficult to realize a vacuum window that meets system requirements for filtering, x-ray transmission, and mechanical stability.

Figure 10:
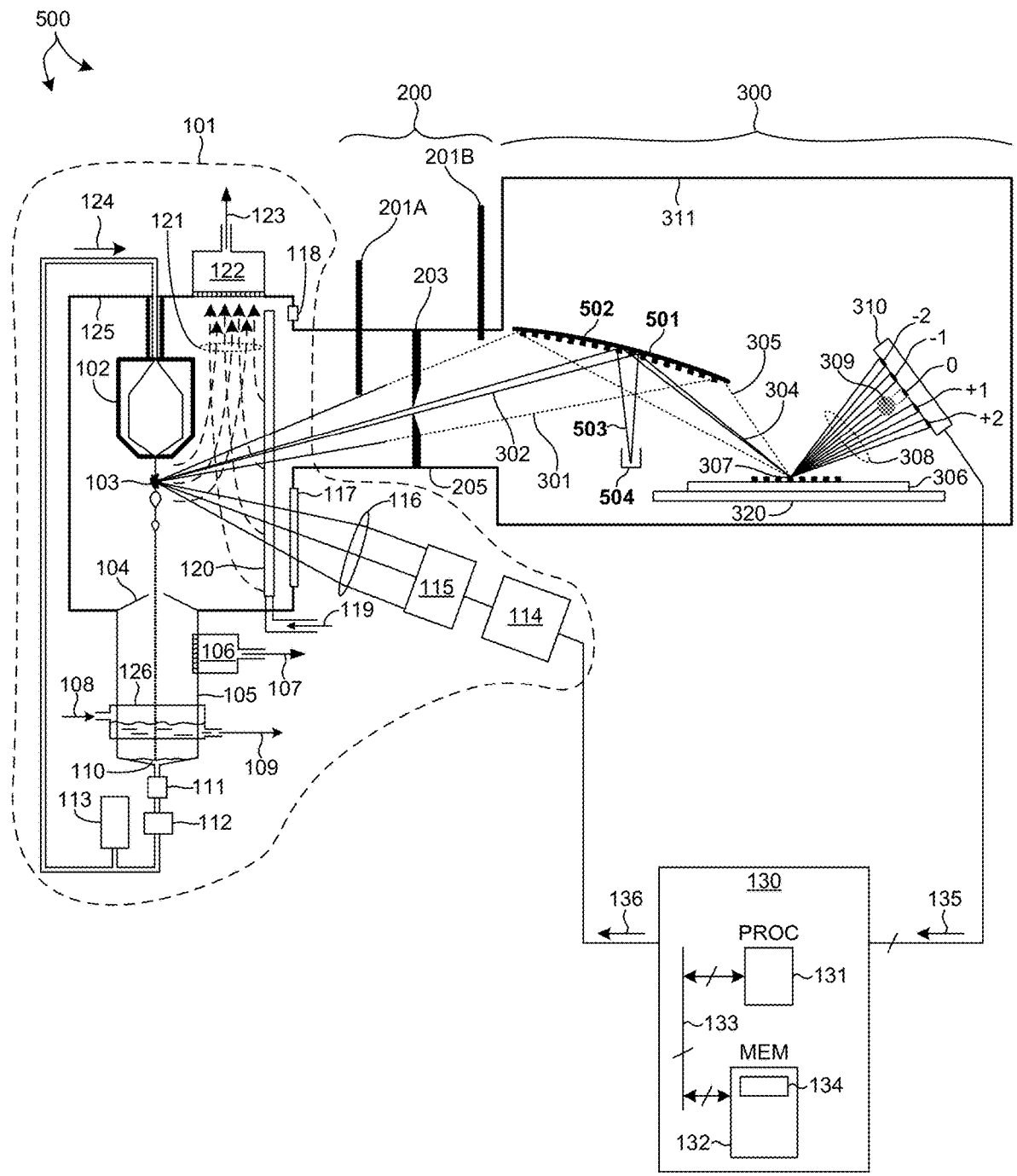
FIG. 10 is a simplified diagram illustrative of yet another embodiment of a metrology system including a liquid sheet jet LPP X-ray illumination source for measuring characteristics of a specimen in at least one novel aspect.

In another aspect, an x-ray based metrology system includes a multilayer diffractive optical structure in the illumination path to filter the X-ray illumination light. In this manner, the need for a vacuum window in the illumination path is eliminated. FIG. 10 depicts an x-ray based metrology system 500 in another embodiment. Like numbered elements depicted in FIG. 10 are analogous to those described with reference to FIG. 2.

As depicted in FIG. 10, ellipsoid mirror 501 is coated with three-dimensional multilayer diffraction optical structure 502. In some embodiments, the 3D multilayer structure 502 is a blazed grating. In other embodiments, the 3D multilayer structure 502 is a Lamellar grating. The angular dispersion of different wavelengths from three-dimensional multilayer diffraction optical structure 502 filters out unwanted radiation from the X-ray illumination light, thus enhancing spectral purity. Light from the pulsed laser illumination source 114 (e.g., IR light) and unwanted wavelengths generated by plasma 103 (e.g., UV, EUV, or both) are diffracted at a different angle than light generated by plasma 103 (e.g., SXR light). The undesirable IR light is directed to a beam dump 504 and the desirable SRX light propagates to wafer 306.

To maintain a difference in vacuum plasma chamber 125 and the wafer metrology chamber 311, the two chambers are differentially pumped at aperture system 203. In the embodiment depicted in FIG. 10, aperture system 203 is sealed with respect to beamline 200 around the outside of the aperture. Hence, the only clear path between plasma chamber 125 and the wafer metrology chamber 311 is through the very small aperture of aperture system 203. Differential pumping is sufficient to maintain separate vacuum levels in plasma chamber 125 and the wafer metrology chamber 311.

Figure 11:
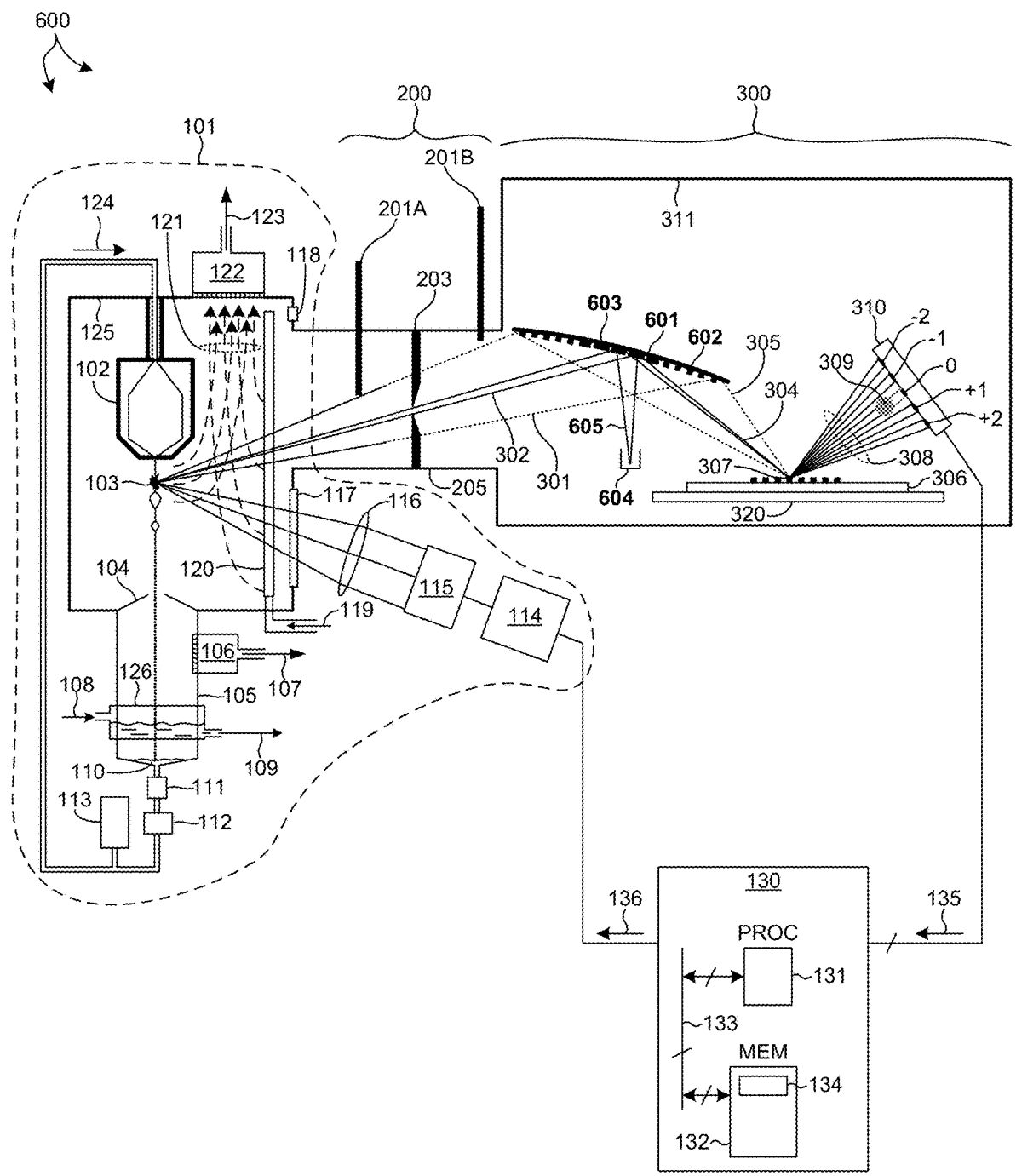
FIG. 11 is a simplified diagram illustrative of yet another embodiment of a metrology system including a liquid sheet jet LPP X-ray illumination source for measuring characteristics of a specimen in at least one novel aspect.

In another aspect, an x-ray based metrology system includes a zone plate structure in the illumination path to refocus excitation light back to the laser produced plasma source. FIG. 11 depicts an x-ray based metrology system 600 in another embodiment. Like numbered elements depicted in FIG. 11 are analogous to those described with reference to FIG. 2.

As depicted in FIG. 11, a zone plate structure 603 is fabricated on ellipsoid mirror 601. In turn, a three-dimensional multilayer diffraction optical structure 602 is deposited on zone plate structure 603 and ellipsoid mirror 601. In some embodiments, the 3D multilayer structure 602 is a blazed grating. In other embodiments, the 3D multilayer structure 602 is a Lamellar grating. Incident infrared light from pulsed laser illumination source 114 is scattered by zone plate structure 603 onto the reflective surface of ellipsoid mirror 601, which refocuses the scattered infrared light back to plasma 103. Additional, unwanted wavelengths 605 generated by plasma 103 (e.g., UV, EUV, or both) are diffracted by the 3D multilayer structure 602 to beam dump 604, and the desirable SRX light propagates to wafer 306.

To maintain a difference in vacuum plasma chamber 125 and the wafer metrology chamber 311, the two chambers are differentially pumped at aperture system 203. In the embodiment depicted in FIG. 11, aperture system 203 is sealed with respect to beamline 200 around the outside of the aperture. Hence, the only clear path between plasma chamber 125 and the wafer metrology chamber 311 is through the very small aperture of aperture system 203. Differential pumping is sufficient to maintain separate vacuum levels in plasma chamber 125 and the wafer metrology chamber 311.

In a further aspect, the flux of X-ray illumination light generated by a liquid sheet jet LPP illumination source is monitored and controlled. FIG. 2 depicts a flux sensor 118 located near the entrance of beamline 200. Measured values of x-ray flux are communicated to computing system 130. In response, computing system 130 compares the measured flux with a desired flux and communicates control commands 136 to pulsed laser illumination source 114 to adjust the output of pulsed laser illumination source 114 to reduce the difference between the measured flux and the desired flux.

In some embodiments, the wavelengths emitted by plasma 103 are selectable. In some embodiments, pulsed laser illumination source 114 is controlled by computing system 130 to maximize flux generated by plasma 103 in one or more selected spectral regions. Pump laser peak intensity at the target material controls the plasma temperature and thus the spectral region of emitted radiation. Pump laser peak intensity is varied by adjusting pulse energy, pulse width, or both. In one example, a 100 picosecond pulse width is suitable for generating SXR radiation. As depicted in FIG. 2, computing system 130 communicates command signals 136 to pulsed laser illumination source 114 that cause pulsed laser illumination source 114 to adjust the spectral range of wavelengths emitted from plasma 103.

It should be recognized that the various steps described throughout the present disclosure may be carried out by a single computer system 130 or, alternatively, a multiple computer system 130. Moreover, different subsystems of the system 100, such as the specimen positioning system 320, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the pulsed laser illumination source 114, aperture system 203, specimen positioning system 320, and detector 310 in any manner known in the art. For example, the one or more computing systems 130 may be coupled to computing systems associated with the pulsed laser illumination source 114, aperture system 203, specimen positioning system 320, and detector 310, respectively. In another example, any of the pulsed laser illumination source 114, aperture system 203, specimen positioning system 320, and detector 310 may be controlled directly by a single computer system coupled to computer system 130.

The computer system 130 may be configured to receive and/or acquire data or information from the subsystems of the system (e.g., pulsed laser illumination source 114, aperture system 203, specimen positioning system 320, and detector 310, and the like) by a transmission medium that may include wireline and/or wireless portions. In this manner, the transmission medium may serve as a data link between the computer system 130 and other subsystems of the system 100.

Computer system 130 of the metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or external systems). For example, the computing system 130 may be configured to receive measurement data (e.g., signals 135) from a storage medium (i.e., memory 132 or 190) via a data link. For instance, intensity results obtained using detector 310 may be stored in a permanent or semi-permanent memory device (e.g., memory 132 or 190). In this regard, the measurement results may be imported from on-board memory or from an external memory system. Moreover, the computer system 130 may send data to other systems via a transmission medium. For instance, specimen parameter values 186 determined by computer system 130 may be stored in a permanent or semi-permanent memory device (e.g., memory 190). In this regard, measurement results may be exported to another system.

Computing system 130 may include, but is not limited to, a personal computer system, mainframe computer system, workstation, image computer, parallel processor, cloud based computing system, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 2, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

Figure 12:
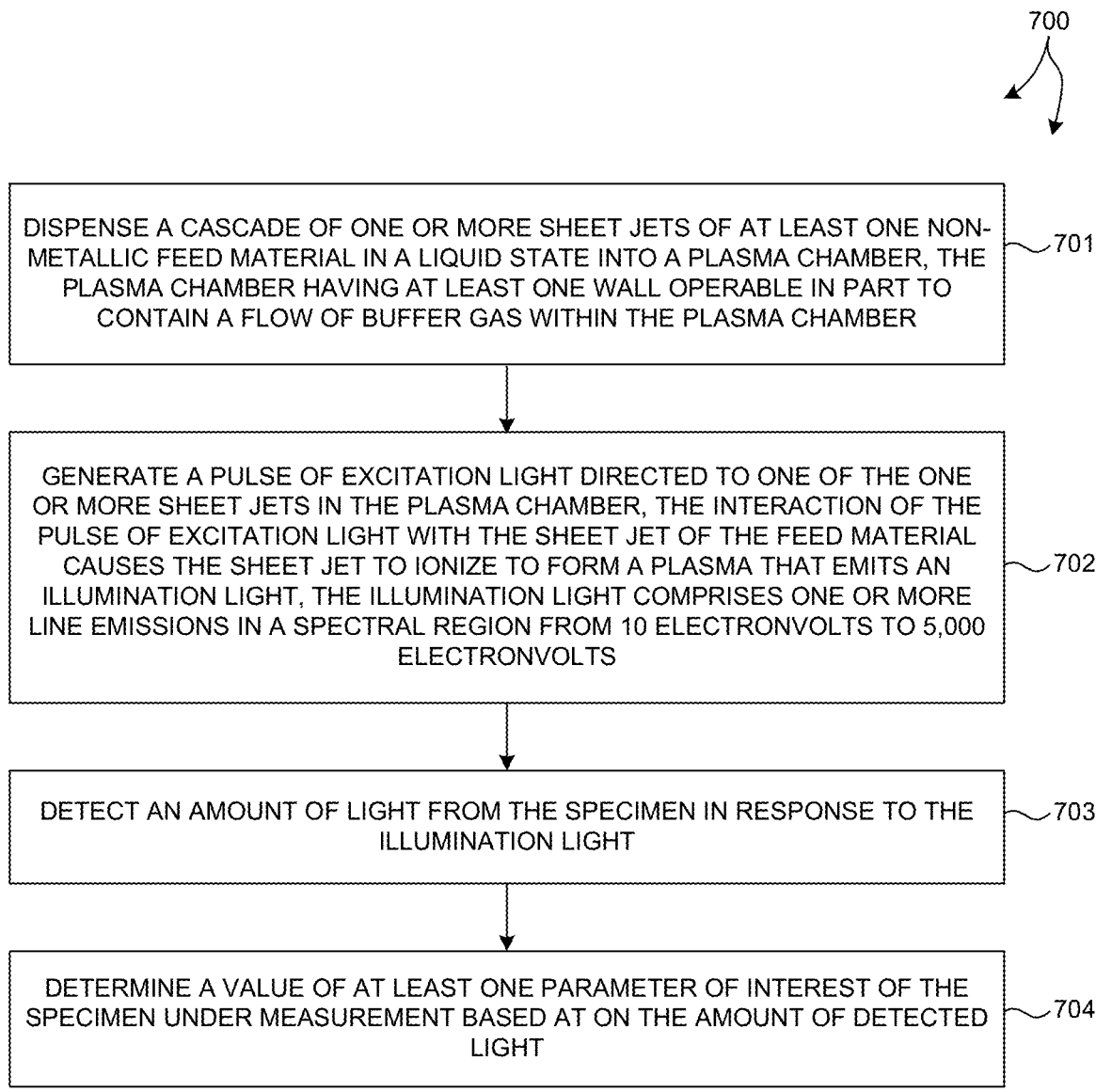
FIG. 12 is a flowchart of a method of performing measurements of a semiconductor wafer with a metrology system employing a liquid sheet jet LPP X-ray illumination source in accordance with the methods described herein.

FIG. 12 illustrates a method 700 suitable for implementation by the metrology systems 100, 400, 500, and 600 of the present invention. In one aspect, it is recognized that data processing blocks of method 700 may be carried out via a pre-programmed algorithm executed by one or more processors of computing system 130. While the following description is presented in the context of metrology systems 100, 400, 500, and 600, it is recognized herein that the particular structural aspects of metrology systems 100, 400, 500, and 600 do not represent limitations and should be interpreted as illustrative only.

In block 701, a cascade of one or more sheet jets of at least one non-metallic feed material in a liquid state is dispensed into a plasma chamber. The plasma chamber has at least one wall operable in part to contain a flow of buffer gas within the plasma chamber.

In block 702, a pulse of excitation light is generated and directed to one of the one or more sheet jets in the plasma chamber. The interaction of the pulse of excitation light with the sheet jet of the feed material causes the sheet jet to ionize to form a plasma that emits an illumination light. The illumination light comprises one or more line emissions in a spectral region from 10 electronvolts to 5,000 electronvolts.

In block 703, an amount of light is detected from the specimen in response to the illumination light.

In block 704, a value of at least one parameter of interest of the specimen under measurement is determined based at on the amount of detected light.

In some embodiments, scatterometry measurements as described herein are implemented as part of a fabrication process tool. Examples of fabrication process tools include, but are not limited to, lithographic exposure tools, film deposition tools, implant tools, and etch tools. In this manner, the results of a RSAXS analysis are used to control a fabrication process. In one example, RSAXS measurement data collected from one or more targets is sent to a fabrication process tool. The RSAXS measurement data is analyzed as described herein and the results used to adjust the operation of the fabrication process tool to reduce errors in the manufacture of semiconductor structures.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, thickness, overlay, and material parameters such as electron density, composition, grain structure, morphology, stress, strain, and elemental identification. In some embodiments, the metrology target is a periodic structure. In some other embodiments, the metrology target is aperiodic.

In some examples, measurements of critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM) are performed with RSAXS measurement systems as described herein.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology systems described herein may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the measurement techniques described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, XRF disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A laser produced plasma light source, comprising:
   a plasma chamber having at least one wall operable in part to contain a flow of buffer gas within the plasma chamber;
   a liquid sheet jet nozzle that dispenses a cascade of one or more sheet jets of a non-metallic feed material in a liquid state into the plasma chamber; and
   a pulsed laser that generates a pulse of excitation light directed to one of the one or more sheet jets of the feed material in the plasma chamber, wherein the interaction of the pulse of excitation light with the sheet jet of the feed material causes the sheet jet to ionize to form a plasma that emits an illumination light, wherein the illumination light comprises one or more line emissions in a spectral region from 10 electronvolts to 5,000 electronvolts, wherein the illumination light is useable to illuminate a specimen under measurement.

2. The laser produced plasma light source of claim 1, wherein the liquid sheet jet nozzle includes two capillary tubes that each terminate at an exit aperture of the liquid sheet jet nozzle, wherein the two capillary tubes are spatially separated at the exit aperture, and wherein a merging of flows from each of the capillary tubes beyond the exit aperture of the liquid sheet jet nozzle generates the cascade of one or more sheet jets of the non-metallic feed material.

3. The laser produced plasma light source of claim 1, wherein the liquid sheet jet nozzle includes a planar shaped cavity that converges at an exit aperture of the liquid sheet jet nozzle, wherein a convergence of flow through the planar shaped cavity at the exit aperure of the liquid sheet jet nozzle generates the cascade of one or more sheet jets of the non-metallic feed material.

4. The laser produced plasma light source of claim 1, wherein the non-metallic feed material is a material comprising one of more elements each having an atomic number less than 19.

5. The laser produced plasma light source of claim 4, wherein the non-metallic feed material includes a first non-metallic feed material comprising one or more elements each having an atomic number less than 19 dissolved in a solvent, the solvent comprising elements each having an atomic number less than 19.

6. The laser produced plasma light source of claim 1, further comprising:
   a liquid recycling system configured to collect a portion of the liquid feed material dispensed by the liquid sheet jet nozzle and provide the collected portion of the liquid feed material to an input port of the liquid sheet jet nozzle.

7. The laser produced plasma light source of claim 6, the liquid recycling system including a liquid trap having an inlet opened to the plasma chamber, and a vacuum pump coupled to the liquid trap, wherein the vacuum pump evacuates an amount of feed material evaporated from the collected liquid feed material from the liquid trap.

8. The laser produced plasma light source of claim 1, further comprising:
   one or more gas manifolds disposed within the plasma chamber, wherein the one or more gas manifolds disperse a flow of buffer gas into the plasma chamber; and
   a vacuum pump coupled to the plasma chamber, wherein the vacuum pump evacuates the flow of buffer gas along with debris generated by the plasma entrained in the flow of buffer gas from the plasma chamber.

9. The laser produced plasma light source of claim 8, wherein the buffer gas is nitrogen, hydrogen, oxygen, argon, neon, or any combination thereof.

10. The laser produced plasma light source of claim 1, wherein a distance from an exit aperture of the liquid sheet jet nozzle to a location of incidence of the pulse of excitation light with the sheet jet of the feed material is in a range between 1 centimeter and 10 centimeters.

11. The laser produced plasma light source of claim 1, wherein a distance between a window of the plasma chamber and the plasma is at least 10 centimeters.

12. The laser produced plasma light source of claim 1, wherein a thickness of the sheet jet of the feed material at a location of incidence of the pulse of excitation light with the sheet jet of the feed material is in a range between 1 micrometer and 5 micrometers.

13. The laser produced plasma light source of claim 1, wherein a brilliance of the plasma is greater than $10^{13}$ photons/(sec)·(mm$^2$)·(mrad$^2$)·(1% bandwidth).

14. The laser produced plasma light source of claim 1, wherein the spot size of the plasma is less than 100 micrometers.

15. A metrology system comprising:
   a laser produced plasma light source comprising:
      a plasma chamber having at least one wall operable in part to contain a flow of buffer gas within the plasma chamber;
      a liquid sheet jet nozzle that dispenses a cascade of one or more sheet jets of a non-metallic feed material in a liquid state into the plasma chamber;
      a pulsed laser that generates a pulse of excitation light directed to one of the one or more sheet jets of the feed material in the plasma chamber, wherein the interaction of the pulse of excitation light with the sheet jet of the feed material causes the sheet jet to ionize to form a plasma that emits an illumination light, wherein the illumination light comprises one or more line emissions in a spectral region from 10 electronvolts to 5,000 electronvolts, wherein the illumination light is useable to illuminate a specimen under measurement;

one or more optical elements in an illumination path between the plasma and the specimen under measurement;

one or more x-ray detectors that detect an amount of light from the specimen in response to the illumination light incident on the specimen; and a computing system configured to determine a value of a parameter of interest characterizing the specimen under measurement based on the detected amount of light.

16. The metrology system of claim 15, wherein the metrology system is configured as a reflective small angle x-ray scatterometry system.

17. The metrology system of claim 15, the one or more optical elements in the illumination path including an ellipsoidal mirror that focuses the illumination light incident to the specimen.

18. The metrology system of claim 17, the ellipsoidal mirror including a multilayer diffractive optical structure fabricated on the ellipsoidal mirror, wherein the multilayer diffractive optical structure diffracts a first portion of the illumination light incident on the ellipsoidal mirror toward a beam dump and a second portion of the illumination light incident on the ellipsoidal mirror toward the specimen under measurement.

19. The metrology system of claim 17, the ellipsoidal mirror including a zone plate structure fabricated on the ellipsoidal mirror, and a multilayer diffractive optical structure fabricated on the ellipsoidal mirror over the zone plate structure, wherein the zone plate structure scatters a first portion of the illumination light incident on the ellipsoidal mirror back to the plasma, wherein the multilayer diffractive optical structure diffracts a second portion of the illumination light incident on the ellipsoidal mirror toward a beam dump and a third portion of the illumination light incident on the ellipsoidal mirror toward the specimen under measurement.

20. A method comprising:

dispensing a cascade of one or more sheet jets of at least one non-metallic feed material in a liquid state into a plasma chamber, the plasma chamber having at least one wall operable in part to contain a flow of buffer gas within the plasma chamber;

generating a pulse of excitation light directed to one of the one or more sheet jets in the plasma chamber, wherein the interaction of the pulse of excitation light with the sheet jet of the feed material causes the sheet jet to ionize to form a plasma that emits an illumination light, wherein the illumination light comprises one or more line emissions in a spectral region from 10 electronvolts to 5,000 electronvolts;

detecting an amount of light from the specimen in response to the illumination light; and determining a value of at least one parameter of interest of the specimen under measurement based at on the amount of detected light.

21. The method of claim 20, wherein the non-metallic feed material is a material comprising one or more elements each having an atomic number less than 19.

22. The method of claim 21, wherein the non-metallic feed material includes a first non-metallic feed material comprising one of more elements each having an atomic number less than 19 dissolved in a solvent, the solvent comprising elements each having an atomic number less than 19.

23. The method of claim 20, further comprising:

collecting a portion of the liquid feed material dispensed by the liquid sheet jet nozzle; and providing the collected portion of the liquid feed material to an input port of a liquid sheet jet nozzle that dispenses the cascade of one or more sheet jets into the plasma chamber.

* * * * *